United States Patent [19]

Miyanishi

[11] Patent Number: 5,369,614
[45] Date of Patent: Nov. 29, 1994

[54] DETECTING AMPLIFIER WITH CURRENT MIRROR STRUCTURE

[75] Inventor: Hideji Miyanishi, Toyonaka, Japan

[73] Assignee: Ricoh Company, Ltd., Tokyo, Japan

[21] Appl. No.: 109,375

[22] Filed: Aug. 19, 1993

Related U.S. Application Data

[63] Continuation-in-part of Ser. No. 975,807, Nov. 13, 1992, abandoned.

[30] Foreign Application Priority Data

Oct. 12, 1992 [JP] Japan .................. 4-272786
Nov. 30, 1992 [JP] Japan .................. 4-319891

[51] Int. Cl.⁵ .......................................... G11C 7/02
[52] U.S. Cl. .................... 365/207; 365/210; 365/206; 365/189.01
[58] Field of Search ............ 365/206, 210, 207, 208, 365/189.01, 206; 307/530

[56] References Cited

U.S. PATENT DOCUMENTS 5,022,003  6/1991  Kohno .................... 365/208
5,029,138  7/1991  Iwashita ................. 365/207
5,056,063 10/1991  Santin et al. ........... 365/208
5,267,207 11/1993  Jinbo .................... 365/207

*Primary Examiner*—Eugene R. LaRoche
*Assistant Examiner*—Vu Le
*Attorney, Agent, or Firm*—Cooper & Dunham

[57] ABSTRACT

A detecting amplifier has a first transistor arranged between a first positive power source and a semiconductor memory and connected in series to the first positive power source and having a low turning-on resistance value; a second transistor arranged between the first transistor and the semiconductor memory and connected in series to the first transistor and connected to a negative feedback circuit having an inverting element; and a third transistor arranged between a second positive power source and an output section of the detecting amplifier and connected in series to the second positive power source and constituting a current mirror structure together with the first transistor. In accordance with this detecting amplifier, an access time to a memory transistor is maintained in a short state and a detecting operation of the detecting amplifier is reliably performed.

15 Claims, 16 Drawing Sheets

DETECTING AMPLIFIER WITH CURRENT MIRROR STRUCTURE

CROSS-REFERENCE TO RELATED APPLICATIONS

This application is a continuation-in-part of application Ser. No. 07/975,807 filed Nov. 13, 1992, which is now abandoned.

BACKGROUND OF THE INVENTION

1. Field of the Invention

The present invention relates to a detecting amplifier included in a reading section in which data are read out of a data storage section disposed in an integrated circuit.

2. Description of the Related Art

In an integrated circuit in which a logic circuit section and a memory circuit section are disposed within the same chip, the memory circuit section has an input section, a decoding section, a selecting section, a detecting amplifier, and an output section. The input section receives address data for designating a memory transistor for reading stored data out of a memory array section. The decoding section makes X and Y directional data for specifying the memory transistor based on the address data. The selecting section selects the stored data read out of the memory array section on the basis of an output signal of the decoding section. The detecting amplifier detects an electric potential of data transmitted from the selecting section. The output section transmits data from the detecting amplifier to a constructional portion outside the memory circuit section.

The memory array section has a well-known circuit structure. The selecting section has a well-known circuit structure. The memory array section and the selecting section constitute a semiconductor memory means.

The above detecting amplifier comprises two N-channel MOS transistors, two P-channel MOS transistors and two inverters, and further comprises two N-channel MOS transistors for negative feedback of the inverters.

An input side of the detecting amplifier connected to the selecting section is connected to source sides of the two N-channel MOS transistors and an input side of a first inverter. An N-channel MOS transistor is called an NMOS transistor in the following description. An output side of the first inverter is connected to gates of the two NMOS transistors. A drain side of one NMOS transistor is connected in series to a drain side of a P-channel MOS transistor. The P-channel MOS transistor is called a PMOS transistor in the following description. An electric signal $\phi$ p described later is supplied to a gate of the PMOS transistor. A source side of the PMOS transistor is connected to a positive power source. A drain side of another NMOS transistor is connected in series to a drain side of another PMOS transistor. A gate of another PMOS transistor is connected to the ground. A source side of another PMOS transistor is connected to a positive power source.

Two NMOS transistors for negative feedback are connected in series to each other between an output side of the first inverter and the input side of the detecting amplifier. These two NMOS transistors for negative feedback are disposed to remove noises in a positive direction caused in the detecting amplifier. A gate of one NMOS transistor for negative feedback is connected to a connection point between another PMOS transistor and another NMOS transistor. The above electric signal $\phi$ p is supplied to a gate of another NMOS transistor for negative feedback. The connection point between another PMOS transistor and another NMOS transistor is connected to an input side of the above output section through a second inverter.

An operation of the detecting amplifier constructed as above will next be explained. Data transmitted from the selecting section are first supplied to the first inverter so that a signal potential level is inverted by this first inverter. This inverted signal is then supplied to the gate of another NMOS transistor to control turning-on and turning-off operations of another NMOS transistor. Namely, the first inverter is operated to approximately maintain an input side potential of the detecting amplifier at the inverted potential level of the first inverter.

For example, when a memory transistor selected within the memory array section has a high resistance or is turned off, the input side potential of the detecting amplifier is set to a high potential. Accordingly, the potential level of an electric signal supplied to the gate of another NMOS transistor is changed by an action of the first inverter so that another NMOS transistor is turned off. Therefore, an input side of the second inverter disposed in the output section of the detecting amplifier is connected to the positive power source through another PMOS transistor turned on at any time. Accordingly, the input side of the second inverter has a high potential level so that a potential level of the detecting amplifier on an output side thereof is changed to a low potential level by the action of the second inverter.

In contrast to this, when the above memory transistor selected within the memory array section has a low resistance or is turned on, another NMOS transistor is turned on by the action of the first inverter and this turning-on state is held. The input side of the second inverter has a relatively low potential level determined by an electric current flowing through another PMOS transistor and a turning-on electric current of the above memory transistor. In this case, the above potential cannot be held on the input side of the detecting amplifier by a turning-on resistance value of another PMOS transistor. Accordingly, there is a case in which the input side of the detecting amplifier has a potential lower than the inverted potential of the first inverter.

Thereafter, when the next selected memory transistor has a high resistance or is turned off, no detecting amplifier is normally operated until the input side potential of the detecting amplifier is recovered. Namely, another NMOS transistor is not turned off. A time required to recover the input side potential of the detecting amplifier is determined by the turning-on resistance value of another PMOS transistor. Normally, this turning-on resistance value of another PMOS transistor is set to a considerably large value so as to provide a sufficiently large potential difference by a turning-on electric current of the memory transistor which does not have a large current value. Accordingly, it takes much time to recover the input side potential of the detecting amplifier.

The PMOS transistor and the NMOS transistor are disposed to solve this problem. An operation of the PMOS transistor is controlled by inputting a clock signal to the gate of this PMOS transistor. The NMOS transistor is connected in series to the PMOS transistor. The output voltage of the first inverter is applied to a gate of the NMOS transistor. Turning-on resistance values of the PMOS transistor and the NMOS transistor are set to be relatively low so as to rapidly recover the input side potential of the detecting amplifier.

However, in the above detecting amplifier, no input side of the second inverter for output can have a normal electric potential for a period providing a low potential level of the clock signal since a turning-on electric current of a memory transistor and electric currents of the PMOS transistor and the NMOS transistor are detoured on the input side of the second inverter. Therefore, no detecting amplifier is normally operated. This problem constitutes a first problem. Accordingly, no access time can be set to be shorter than a constant time irrespective a solving method for reducing the above long recovery time.

Further, there is a possibility that no sufficiently low potential can be supplied to the second inverter by dispersions in turning-on resistance value of another PMOS transistor and turning-on electric current of the memory transistor. This problem constitutes a second problem.

In the general detecting amplifier, when the memory transistor has a high resistance or is turned off and the clock signal has a high potential level, input and output sides of the first inverter are short-circuited. Accordingly, the input side of the detecting amplifier temporarily has a low resistance value to absorb noises and maintain the inverted potential of the first inverter. In this case, no detecting amplifier can be normally operated. This problem constitutes a third problem. Furthermore, it takes much time to recover this inverted potential so that no access time can be set to be shorter than a constant time.

SUMMARY OF THE INVENTION

It is therefore an object of the present invention to provide a detecting amplifier for maintaining an access time to a memory transistor in a short state and accurately operated by improving a current-to-voltage amplification factor to improve an accuracy in detection of the detecting amplifier.

In accordance with a first structure of the present invention, the above object can be achieved by a detecting amplifier comprising a first transistor arranged between a first positive power source and semiconductor memory means and connected in series to the first positive power source and having a low turning-on resistance value; a second transistor arranged between the first transistor and the semiconductor memory means and connected in series to the first transistor and connected to a negative feedback circuit having a first inverting element; and a third transistor arranged between a second positive power source and an output section of the detecting amplifier and connected in series to the second positive power source and constituting a current mirror structure together with the first transistor.

In the first structure of the present invention, the output section of the detecting amplifier is connected to an output side of the third transistor. The first and third transistors constitute a current mirror structure. Accordingly, the value of an electric current flowing through the third transistor is proportional to the value of an electric current flowing through the first transistor. Therefore, no electric potential at a connection point between the first and second transistors directly relates to an output signal of the detecting amplifier. Accordingly, a turning-on resistance value of the first transistor can be set to be low by the current mirror structure constructed by the first and third transistors so that a resistance value of the negative feedback circuit of the first inverting element can be reduced. Therefore, an electric potential in an input section of the detecting amplifier can be set to be constant for a short time so that an access time to a memory transistor can be reduced.

In accordance with a second structure of the present invention, the detecting amplifier further comprises first noise removing means having a fourth transistor having a gate for receiving an output signal of the first inverting element through the second inverting element, and the first noise removing means prevents an increase in electric potential of an input section of the detecting amplifier caused by noises inputted to this input section between the second transistor and the semiconductor memory means.

In the second structure of the present invention, when the electric potential in the input section of the detecting amplifier is increased by inputting noises to this input section, the first noise removing means detects this increase and is operated to restrain this increase in electric potential. Accordingly, since this first noise removing means is disposed, the value of an electric current flowing through the first transistor, i.e., the third transistor is stabilized so that the potential level of an output signal of the detecting amplifier is stabilized.

In accordance with a third structure of the present invention, the detecting amplifier further comprises a fifth transistor arranged between a third positive power source and dummy semiconductor memory means and connected in series to the third positive power source and having a low turning-on resistance value; a sixth transistor arranged between the fifth transistor and the dummy semiconductor memory means and connected in series to the fifth transistor and connected to a negative feedback circuit having a third inverting element; a seventh transistor connected in series to a fourth positive power source and constituting a current mirror structure together with the fifth transistor; second noise removing means having an eighth transistor having a gate for receiving an output signal of the third inverting element through a fourth inverting element; the second noise removing means preventing an increase in electric potential of an input section caused by noises inputted to this input section between the sixth transistor and the dummy semiconductor memory means; and an output signal stabilizing section having ninth and tenth transistors which are respectively connected in series to the third transistor and the seventh transistor and constitute a current mirror structure.

In the third structure of the present invention, the dummy semiconductor memory means is constructed by a semiconductor memory transistor having a low turning-on resistance value. Accordingly, the value of an electric current flowing through the seventh transistor is used as a simulation value thereof when the semiconductor memory transistor having the low turning-on resistance value is selected. The tenth transistor is connected in series to the seventh transistor and constitutes a current mirror structure together with the ninth transistor. The ninth transistor is connected in series to the third transistor. Thus, the value of an electric current flowing through the seventh transistor is proportional to the value of an electric current flowing through the third transistor. Accordingly, in this third structure, a detecting operation of the detecting amplifier is corrected to transmit a signal having a correct potential level from the detecting amplifier even when a memory transistor having a different turning-on resistance value is selected in accordance with a manufacturing condition of the detecting amplifier.

In accordance with a fourth structure of the present invention, a detecting amplifier comprises an eleventh transistor arranged between a fifth positive power source and semiconductor memory means and connected in series to the fifth positive power source and having a low turning-on resistance value; a twelfth transistor arranged between the eleventh transistor and the semiconductor memory means and connected in series to the eleventh transistor and connected to a negative feedback circuit having a fifth inverting element; and a thirteenth transistor arranged between the fifth positive power source and the ground and connected in series to the fifth positive power source and constituting a current mirror structure together with the eleventh transistor; a fourteenth transistor connected between the thirteenth transistor and the ground; a fifteenth transistor arranged between a sixth positive power source and an output section of the detecting amplifier and connected in series to the sixth positive power source; and a sixteenth transistor connected between the output section of the detecting amplifier and the ground and constituting a current mirror structure together with the fourteenth transistor.

In the fourth structure, operations of the eleventh to thirteenth transistors are similar to those of the above first to third transistor. The fourteenth transistor is turned on when an electric current flows through the thirteenth transistor. The fourteenth and sixteenth transistors constitute a current mirror structure. Accordingly, an electric current flowing through the fourteenth transistor is proportional to an electric current flowing through the sixteenth transistor. Further, an output potential of the detecting amplifier is determined by an electric current flowing through the fifteenth transistor and the electric current flowing through the sixteenth transistor. Thus, no circuit connection of the fifteenth transistor relates to a precharging operation for recovering an electric potential on an input side of the detecting amplifier. Accordingly, the electric current of the fifteenth transistor can be approximately set to an ideal constant characteristic value. The electric current of the sixteenth transistor is approximately set to be constant. Accordingly, a connection point between the fifteenth and sixteenth transistors is set to an output terminal of the detecting amplifier. Thus, the fifteenth and sixteenth transistors are operated to improve a current-to-voltage amplification factor of the detecting amplifier so that a detecting accuracy in electric potential on an output side of the semiconductor memory means is improved.

In accordance with a fifth structure of the present invention, the detecting amplifier further comprises a seventeenth transistor arranged between a seventh positive power source and dummy semiconductor memory means and connected in series to the seventh positive power source and having a low turning-on resistance value; an eighteenth transistor arranged between the seventeenth transistor and the dummy semiconductor memory means and connected in series to the seventeenth transistor and connected to a negative feedback circuit having a sixth inverting element; a nineteenth transistor arranged between the seventh positive power source and the ground and connected in series to the seventh positive power source and constituting a current mirror structure together with the seventeenth transistor; a twentieth transistor connected between the nineteenth transistor and the ground; a twenty-first transistor arranged between an eighth positive power source and the output section of the detecting amplifier and connected in series to the eighth positive power source and constituting a current mirror structure together with the fifteenth transistor; and a twenty-second transistor connected between the output section of the detecting amplifier and the ground and constituting a current mirror structure together with the twentieth transistor.

In the fifth structure, when turning-on resistance values of the normal side semiconductor memory means are different from each other in accordance with manufacturing conditions of the detecting amplifier and a detecting operation of the normal side detecting amplifier having the fourth structure is abnormal, a dummy side detecting amplifier having the seventeenth to twenty-second transistors and performing a detecting operation of the dummy semiconductor memory means corrects the detecting operation of the normal side detecting amplifier in accordance with differences in turning-on resistance values such that this detecting operation is normal.

In accordance with a sixth structure of the present invention, the detecting amplifier further comprises reference voltage value transmitting means connected to one dummy memory transistor having the same structure as a memory transistor constituting the semiconductor memory means and attaining a turning-on state; the reference voltage value transmitting means detecting a reference current value which is predetermined times the value of an electric current flowing through this dummy memory transistor; precharge detecting means connected to gates of the eleventh and thirteenth transistors and connected to an output side of the reference voltage value transmitting means; the precharge detecting means detecting a precharging state of the semiconductor memory means in which the value of an electric current flowing through the eleventh transistor is equal to or greater than the reference current value by comparing these current values with each other; and current supplying means for strengthening precharge connected to an output side of the precharge detecting means; the current supplying means flowing an additional electric current between the eleventh transistor and the semiconductor memory means in addition to the electric current flowing through the eleventh transistor when the precharge detecting means detects that the semiconductor memory means is in the precharging state.

In the sixth structure, the precharge detecting means detects that an output side of the semiconductor memory means is in a precharging state. When this output side is in the precharging state, the current supplying means for strengthening precharge supplies a precharging current onto the output side of the semiconductor memory means in addition to an electric current supplied through the thirteenth transistor. Accordingly, the precharge detecting means, etc. are operated to reduce a time required to perform the precharging operation of the semiconductor memory means and reduce an access time to a memory transistor.

In accordance with a seventh structure of the present invention, the detecting amplifier further comprises a seventeenth transistor arranged between a seventh positive power source and dummy semiconductor memory means and connected in series to the seventh positive power source and having a low turning-on resistance value; an eighteenth transistor arranged between the seventeenth transistor and the dummy semiconductor memory means and connected in series to the seventeenth transistor and connected to a negative feedback circuit having a seventh inverting element; a nineteenth transistor arranged between the seventh positive power source and the ground and connected in series to the seventh positive power source and constituting a current mirror structure together with the seventeenth transistor; a twentieth transistor connected between the nineteenth transistor and the ground; a twenty-first transistor connected in series to an eighth positive power source and constituting a current mirror structure together with the fifteenth transistor; a twenty-second transistor connected between the twenty-first transistor and the ground and constituting a current mirror structure together with the twentieth transistor; second precharge detecting means connected to gates the seventeenth and nineteenth transistors and connected to the output side of the reference voltage value transmitting means; the second precharge detecting means detecting a precharging state of the dummy semiconductor memory means in which the values of electric currents flowing through the seventeenth and nineteenth transistors are equal to or greater than the reference current value by comparing these current values with each other; and second current supplying means for strengthening precharge connected to an output side of the second precharge detecting means; the second current supplying means flowing an additional electric current between the seventeenth transistor and the dummy semiconductor memory means in addition to the electric current flowing through the seventeenth transistor when the second precharge detecting means detects that the dummy semiconductor memory means is in the precharging state.

In the seventh structure, a dummy side detecting amplifier has the seventeenth to twenty-second transistors, the second precharge detecting means and the second current supplying means for strengthening precharge. When the detecting operation of the normal side detecting amplifier is abnormally performed by memory transistor characteristics different from each other in accordance with manufacturing conditions of this detecting amplifier, the dummy side detecting amplifier corrects this detecting operation such that this detecting operation is normally performed.

In accordance with an eighth structure of the present invention, a detecting amplifier comprises detecting amplifying means having an input side connected to an output side of semiconductor memory means and having a current mirror structure and detecting an electric current value transmitted from a detecting object memory transistor within the semiconductor memory means; dummy detecting amplifying means having an input side connected to an output side of dummy semiconductor memory means obtained by simulating the semiconductor memory means and having a current mirror structure and detecting an electric current value transmitted from a dummy memory transistor within the dummy semiconductor memory means; and load means having a load terminal connected to an input side of detecting output means connected to an output side of the detecting amplifying means; the load means further having a control current input terminal connected to an output terminal of the dummy detecting amplifying means; the load means being constructed such that a reference electric current for determining a current value transmitted from the detecting output means flows through the load means in relation to a current value on the output side of the detecting amplifying means; and the dummy semiconductor memory means being constructed by comparing current generating means for generating an electric current having an intermediate current value between maximum and minimum values of an electric current flowing through the detecting object memory transistor selected by the semiconductor memory means.

In the eighth structure, the comparing current generating means generates an electric current having a current value between the maximum and minimum values of an electric current flowing through the detecting object memory transistor selected by the semiconductor memory means. Accordingly, the reference current flowing through the load means is set to a current value corresponding to each of the maximum and minimum current values so that a detecting accuracy of the detecting amplifier is improved.

In accordance with a ninth structure of the present invention, the comparing current generating means comprises low resistance dummy semiconductor memory means which has a dummy semiconductor memory array having a low turning-on resistance value and is connected to the input side of the dummy detecting amplifying means; high resistance dummy semiconductor memory means which has a dummy semiconductor memory array having a high turning-on resistance value and is connected to the input side of the dummy detecting amplifying means in parallel with an output side of the low resistance dummy semiconductor memory means; and flowing dividing means having the same equivalent resistance value as the dummy detecting amplifying means and having an input side connected to an output side of a parallel connection of the high resistance dummy semiconductor memory means and the low resistance dummy semiconductor memory means.

In the ninth structure, the low resistance dummy semiconductor memory means, the high resistance dummy semiconductor memory means and the flow dividing means set the reference current flowing through the load means to a current value corresponding to each of the maximum and minimum current values so that the detecting accuracy of the detecting amplifier is further improved.

In accordance with a tenth structure of the present invention, a detecting amplifier comprises detecting amplifying means having an input side connected to an output side of semiconductor memory means and having a current mirror structure and detecting an electric current value transmitted from a detecting object memory transistor within the semiconductor memory means; dummy detecting amplifying means having an input side connected to an output side of dummy semiconductor memory means obtained by simulating the semiconductor memory means and having a current mirror structure and detecting an electric current value transmitted from a dummy memory transistor within the dummy semiconductor memory means; and load means having a load terminal connected to an input side of detecting output means connected to an output side of the detecting amplifying means; the load means further having a control current input terminal connected to an output terminal of the dummy detecting amplifying means; the load means being constructed such that a reference electric current for determining a current value transmitted from the detecting output means flows through the load means in relation to a current value on the output side of the detecting amplifying means; the dummy semiconductor memory means including low resistance dummy semiconductor memory means which has a dummy semiconductor memory array having a low turning-on resistance value and is connected to the input side of the dummy detecting amplifying means; and high resistance dummy semiconductor memory means which has a dummy semiconductor memory array having a high turning-on resistance value and is connected to the input side of the dummy detecting amplifying means in parallel with an output side of the low resistance dummy semiconductor memory means; the dummy semiconductor memory means being constructed by comparing current generating means for generating an electric current having an intermediate current value between maximum and minimum values of an electric current flowing through the detecting object memory transistor selected by the semiconductor memory means; and a current amplification factor provided by the current mirror structure of the detecting amplifying means being larger than that provided by the current mirror structure of the dummy detecting amplifying means.

In the tenth structure, with respect to a ratio of current amplification factors of the detecting amplifying means and the dummy detecting amplifying means, the reference current flowing through the load means is set to an intermediate current value between current values corresponding to the maximum and minimum values of an electric current flowing through the detecting object memory transistor selected by the semiconductor memory means. Thus, a detecting accuracy of the detecting amplifier is improved.

In accordance with an eleventh structure of the present invention, the comparing current generating means in each of the eighth and tenth structures comprises semiconductor memory transistors each having a low turning-on resistance value and forming a current path reaching the ground in which the number of series connection stages of these semiconductor memory transistors is equal to or larger than that of memory transistors in the current path of a semiconductor memory array included in the semiconductor memory means toward the ground; and semiconductor memory transistors each having a high turning-on resistance value and connected in parallel to the semiconductor memory array and forming a current path reaching the ground in which the number of stages of these semiconductor memory transistors is equal to or larger than the number of series connection stages of the memory transistors in the current path of the semiconductor memory array included in the semiconductor memory means toward the ground.

In the eleventh structure, the comparing current generating means sets the reference current value to an intermediate current value between current values corresponding to the maximum and minimum values of an electric current flowing through the detecting object memory transistor. Thus, the detecting accuracy of the detecting amplifier is further improved.

Further objects and advantages of the present invention will be apparent from the following description of the preferred embodiments of the present invention as illustrated in the accompanying drawings.

DESCRIPTION OF THE PREFERRED EMBODIMENTS

The preferred embodiments of a detecting amplifier in the present invention will next be described in detail with reference to the accompanying drawings.

Figure 1:
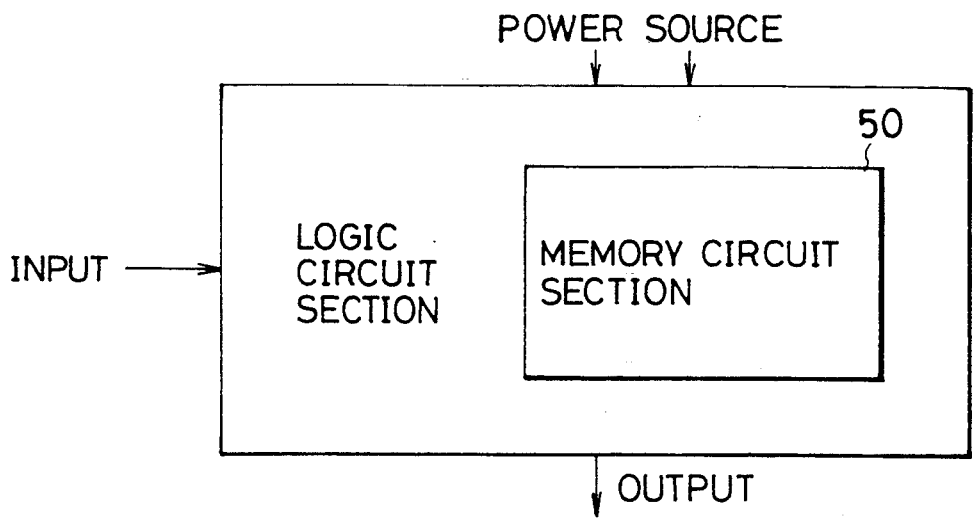
FIG. 1 is a view showing the construction of an integrated circuit having a memory circuit section.
Figure 2:
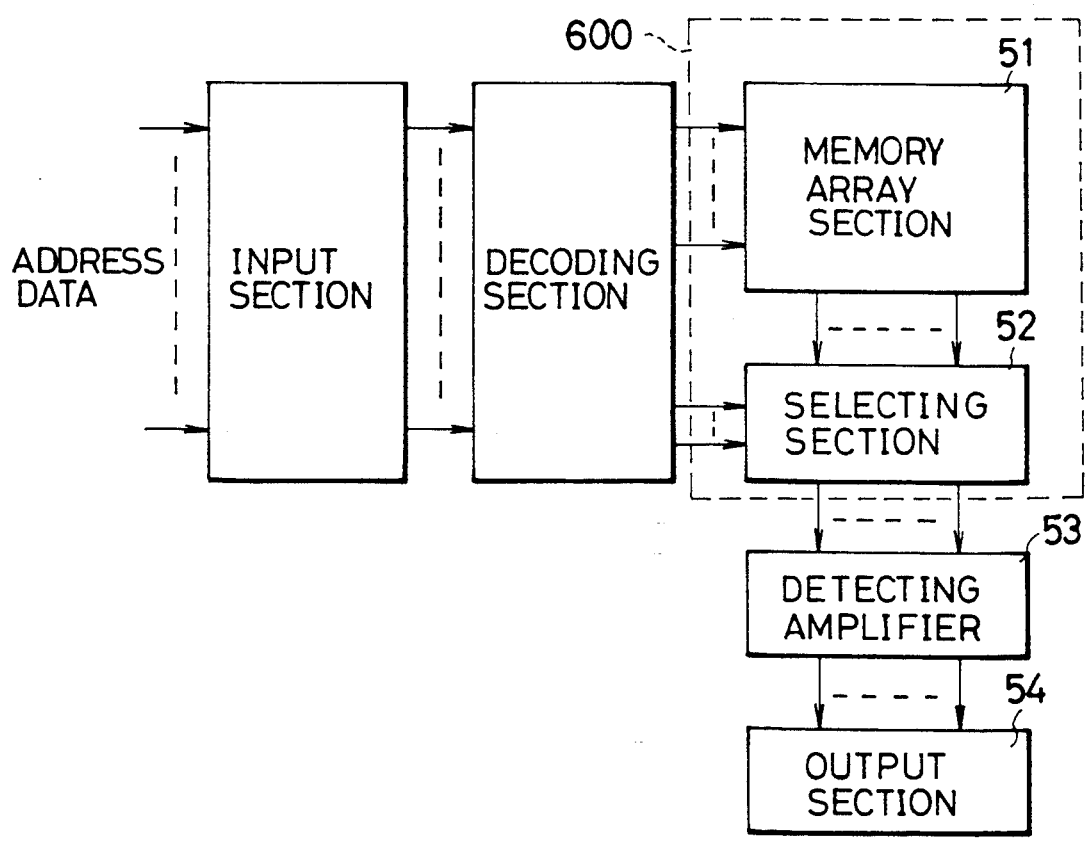
FIG. 2 is a block diagram showing constructional portions for reading data out of the memory circuit section.

FIG. 1 shows an integrated circuit in which a logic circuit section and a memory circuit section 50 are disposed within the same chip. FIG. 2 shows the memory circuit section 50. This memory circuit section 50 has an input section, a decoding section, a selecting section 52, a detecting amplifier 53, and an output section 54. The input section receives address data for designating a memory transistor for reading stored data out of a memory array section 51. The decoding section makes X and Y directional data for specifying the memory transistor based on the address data. The selecting section 52 selects the stored data read out of the memory array section 51 on the basis of an output signal of the decoding section. The detecting amplifier 53 detects an electric potential of data transmitted from the selecting section 52. The output section 54 transmits data from the detecting amplifier 53 to a constructional portion outside the memory circuit section.

Figure 4:
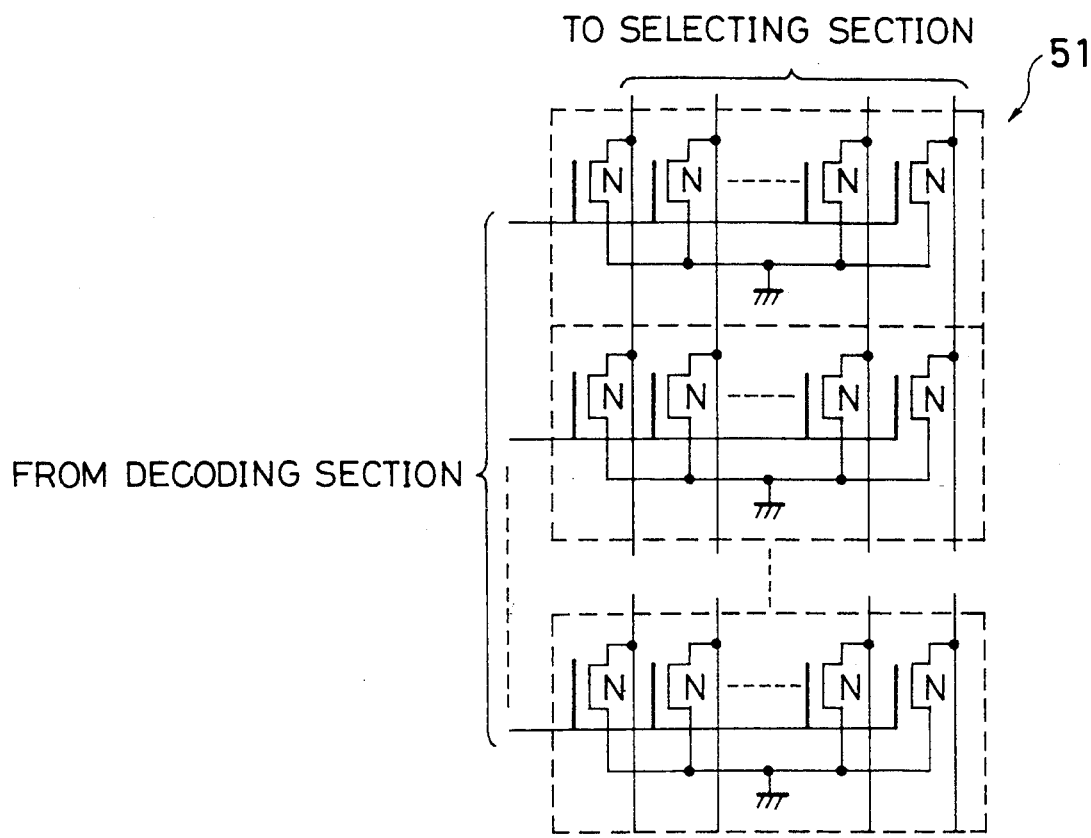
FIG. 4 is a circuit diagram showing an example of the construction of a selecting section shown in FIGS. 2 and 3.
Figure 5:
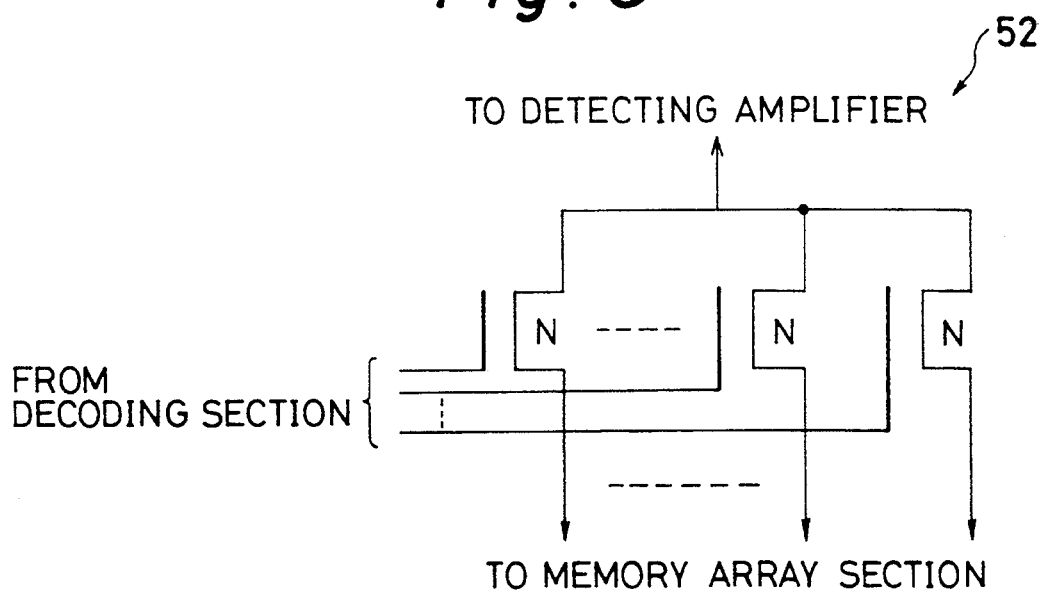
FIG. 5 is a circuit diagram showing an example of the construction of a memory array section shown in FIGS. 2 to 4.

The memory array section 51 has a well-known circuit structure as shown in FIG. 4. The selecting section 52 has a well-known circuit structure as shown in FIG. 5. The memory array section 51 and the selecting section 52 constitute a semiconductor memory means 600.

Figure 3:
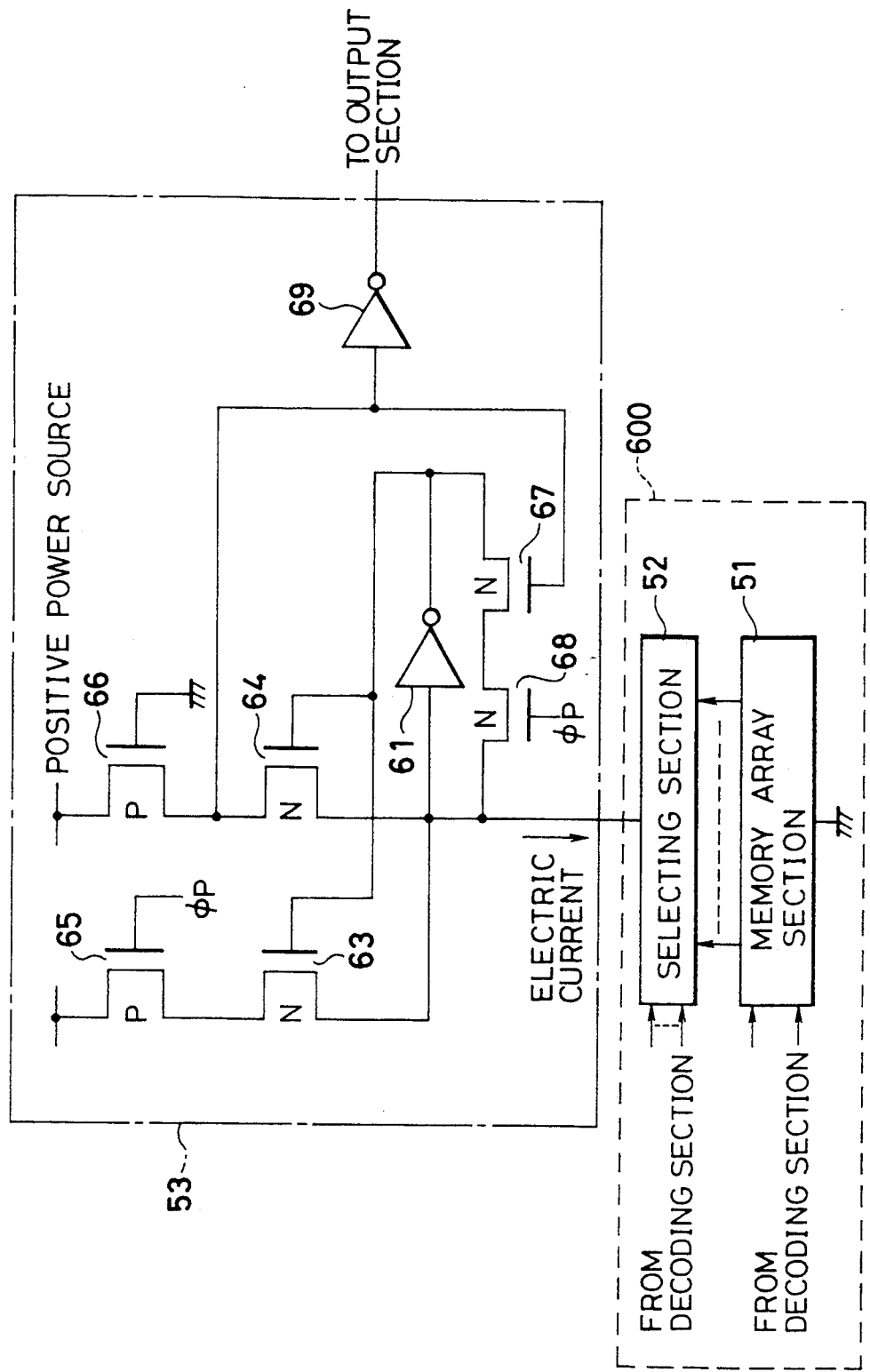
FIG. 3 is a circuit diagram showing the construction of a general detecting amplifier.

The above detecting amplifier 53 is generally constructed as shown in FIG. 3. In FIG. 3, the same constructional portions as those in FIG. 2 are designated by the same reference numerals.

An input side of the detecting amplifier 53 connected to the selecting section 52 is connected to source sides of N-channel MOS transistors 63 and 64 and an input side of an inverter 61. An N-channel MOS transistor is called an NMOS transistor in the following description. An output side of the inverter 61 is connected to gates of the NMOS transistors 63 and 64. A drain side of the NMOS transistor 63 is connected in series to a drain side of a P-channel MOS transistor 65. The P-channel MOS transistor is called a PMOS transistor in the following description. An electric signal $\phi$ p described later is supplied to a gate of the PMOS transistor 65. A source side of the PMOS transistor 65 is connected to a positive power source. A drain side of the NMOS transistor 64 is connected in series to a drain side of a PMOS transistor 66. A gate of the PMOS transistor 66 is connected to the ground. A source side of the PMOS transistor 66 is connected to a positive power source.

NMOS transistors 67 and 68 are connected in series to each other between an output side of the inverter 61 and the input side of the detecting amplifier 53. The NMOS transistors 67 and 68 are disposed for direct negative feedback of the inverter 61 to remove noises in a positive direction caused in the detecting amplifier 53. A gate of the NMOS transistor 67 is connected to a connection point between the PMOS transistor 66 and the NMOS transistor 64. The above electric signal $\phi$ p is supplied to a gate of the NMOS transistor 68. The connection point between the PMOS transistor 66 and the NMOS transistor 64 is connected to an input side of the above output section 54 through an inverter 69.

An operation of the detecting amplifier constructed as above will next be explained. Data transmitted from the selecting section 52 are first supplied to the inverter 61 so that a signal potential level is inverted by this inverter 61. This inverted signal is then supplied to the gate of the NMOS transistor 64 to control turning-on and turning-off operations of the NMOS transistor 64. Namely, the inverter 61 is operated to approximately maintain an input side potential of the detecting amplifier 53 at the inverted potential level of the inverter 61.

For example, when a memory transistor selected within the memory array section 51 has a high resistance or is turned off, the input side potential of the detecting amplifier 53 is set to a high potential in comparison with the inverted potential. Accordingly, the potential level of an electric signal supplied to the gate of the NMOS transistor 64 is changed by an action of the inverter 61 so that the NMOS transistor 64 is turned off. Therefore, an input side of the inverter 69 disposed in the output section of the detecting amplifier 53 is connected to the positive power source through the PMOS transistor 66 turned on at any time. Accordingly, the input side of the inverter 69 has a high potential level so that a potential level of the detecting amplifier 53 on an output side thereof is changed to a low potential level by the action of the inverter 69.

In contrast to this, when the above memory transistor selected within the memory array section 51 has a low resistance or is turned on, the NMOS transistor 64 is turned on by the action of the inverter 61 and this turning-on state is held. The input side of the inverter 69 has a relatively low potential level determined by an electric current flowing through the PMOS transistor 66 and a turning-on electric current of the above memory transistor. In this case, the above potential cannot be held on the input side of the detecting amplifier 53 by a turning-on resistance value of the PMOS transistor 66. Accordingly, there is a case in which the input side of the detecting amplifier 53 has a potential lower than the inverted potential of the inverter 61.

Thereafter, when the next selected memory transistor has a high resistance or is turned off, no detecting amplifier 53 is normally operated until the input side potential of the detecting amplifier 53 is recovered. Namely, no NMOS transistor 64 is turned off. A time required to recover the input side potential of the detecting amplifier 53 is determined by the turning-on resistance value of the PMOS transistor 66. Normally, this turning-on resistance value of the PMOS transistor 66 is set to a considerably large value so as to provide a sufficiently large potential difference by a turning-on electric current of the memory transistor which is not large. Accordingly, it takes much time to recover the input side potential of the detecting amplifier 53.

The PMOS transistor 65 and the NMOS transistor 63 are disposed to solve this problem. An operation of the PMOS transistor 65 is controlled by inputting a clock signal $\phi$ p to the gate of this PMOS transistor 65. The NMOS transistor 63 is connected in series to the PMOS transistor 65. An output potential of the above inverter 61 is applied to the gate of the NMOS transistor 63. Turning-on resistance values of the PMOS transistor 65 and the NMOS transistor 63 are set to be relatively low so as to rapidly recover the input side potential of the detecting amplifier 53.

However, in the detecting amplifier 53 constructed above, no input side of the inverter 69 can have a normal potential for a period providing a low potential level of the clock signal $\phi$ p since a turning-on electric current of the memory transistor and electric currents of the PMOS transistor 65 and the NMOS transistor 63 are detoured on the input side of the inverter 69. Therefore, no detecting amplifier 53 is normally operated. This problem constitutes a first problem. Accordingly, no access time can be set to be shorter than a constant time irrespective of a solving method for reducing the above long recovery time.

Further, there is a possibility that no sufficiently low potential can be supplied to the inverter 69 by dispersions in turning-on resistance value of the PMOS transistor 66 and turning-on electric current of the memory transistor. This problem constitutes a second problem.

As mentioned above, the NMOS transistors 67 and 68 are disposed for direct negative feedback of the inverter 61 to remove noises in a positive direction caused in the detecting amplifier 53. Further, a clock signal $\phi$ p is separately supplied to the gate of the NMOS transistor 68 to control an operation of the NMOS transistor 68 since no inverter 61 negatively fed back is normally operated with respect to the NMOS transistor 64 as mentioned above. Further, the noises in the positive direction are normally considered to be inputted to the detecting amplifier 53 only in a state in which the selected memory transistor has a high resistance or is turned off. The gate of the NMOS transistor 67 is connected to the input side of the inverter 69 by utilizing that the input side of the inverter 69 has a high potential level in such a state. Thus, when the memory transistor has a high resistance or is turned off and the clock signal $\phi$ p has a high potential level, the input and output sides of the inverter 61 are short-circuited. Accordingly, the input side of the detecting amplifier 53 temporarily has a low resistance value to absorb the above noises and maintain the inverted potential of the inverter 61. In this case, no detecting amplifier 53 can be normally operated as mentioned above. This problem constitutes a third problem. Furthermore, it takes much time to recover this inverted potential so that no access time can be set to be shorter than a constant time.

A detecting amplifier in one embodiment of the present invention will next be described in detail with reference to FIG. 6.

Figure 6:
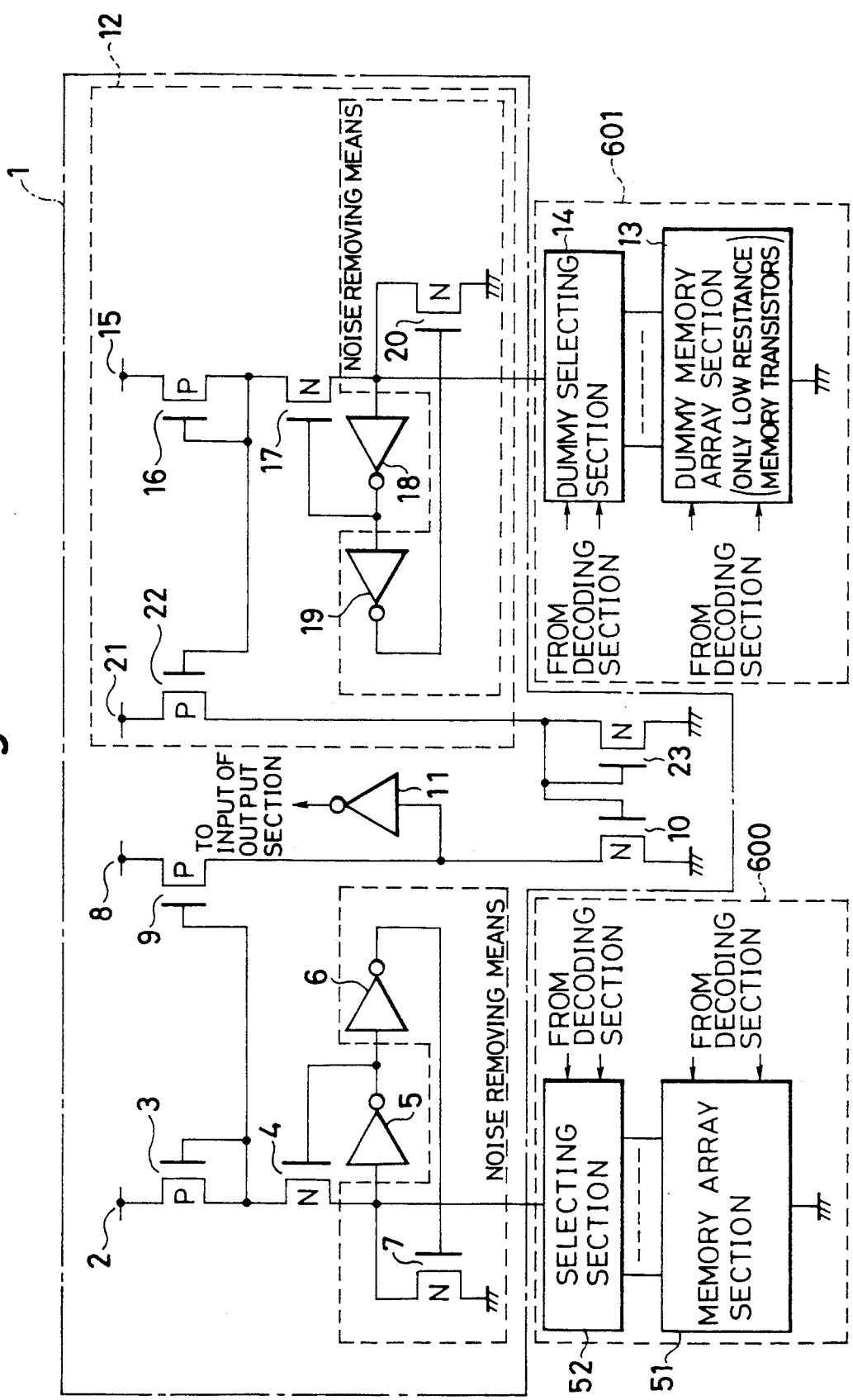
FIG. 6 is a circuit diagram showing the construction of a detecting amplifier in accordance with a first embodiment of the present invention.

In FIG. 6, an input side of a detecting amplifier 1 is connected to an output side of a selecting section 52 and is also connected to a source side of an NMOS transistor 4. A drain side of the NMOS transistor 4 is connected in series to a P-channel MOS diode (or transistor) 3. The P-channel MOS diode is called a PMOS diode in the following description. A source side of the PMOS diode 3 is connected to a positive power source 2. A turning-on resistance value of the PMOS diode 3 is set to be lower than that of a general PMOS diode used in the above circuit structure. For example, in the above circuit structure, a voltage drop value of the general PMOS diode by the turning-on resistance thereof is approximately equal to a power voltage value such as 5 volts. However, a voltage drop value of the PMOS diode 3 in this embodiment is equal to about 0.5 volt and is therefore lower by about ten times than that of the general PMOS diode. No lower limit value of the above voltage drop value is equal to or smaller than a voltage value on a so-called bit line connected from a memory array section 51 to the detecting amplifier through the selecting section 52. An upper limit value of the voltage drop value is set to a voltage value sufficient to operate the above PMOS diode 3 as a current mirror structure described later.

The input side of the above detecting amplifier 1 is also connected to an input side of an inverter 5 connected in series to an inverter 6. The input side of the detecting amplifier 1 is also connected to a drain side of an NMOS transistor 7. A source side of the NMOS transistor 7 is connected to the ground and a gate of this NMOS transistor 7 is connected to an output side of the above inverter 6. An inverted potential of the inverter 6 is set to an intermediate potential between an inverted potential of the inverter 5 and a potential provided by adding a threshold voltage of the NMOS transistor 4 to this inverted potential of the inverter 5.

A connection point between the PMOS diode 3 and the NMOS transistor 4 is connected to a gate of the PMOS diode 3 and a gate of a PMOS transistor 9. A source of the PMOS transistor 9 is connected to a positive power source 8. A turning-on resistance value of the PMOS transistor 9 may be different from that of the above PMOS diode 3. The turning-on resistance value of the PMOS transistor 9 is preferably set to a resistance value equal to or greater than the turning-on resistance value of the PMOS diode 3 at a normal designing time such that the current amplification factor of a current mirror circuit described later is desirably set to be equal to or greater than one.

A drain side of the PMOS transistor 9 is connected in series to an NMOS transistor 10. A source side of the NMOS transistor 10 is connected to the ground. A connection point between the PMOS transistor 9 and the NMOS transistor 10 is connected to an output section through an inverter 11. In the following description, a detecting amplifying section is constructed by the above constructional portions 2 to 9.

In the detecting amplifier constructed above, the PMOS diode 3 and the PMOS transistor 9 constitute a current mirror structure. Accordingly, the value of an electric current flowing through the PMOS transistor 9 is proportional to the value of an electric current flowing through the PMOS diode 3. Therefore, no electric potential level at a connection point between the PMOS transistor and the NMOS transistor is set to a potential lever of an output signal of the detecting amplifier as in the general detecting amplifier.

Accordingly, when a selected memory transistor has a low resistance, turning-on resistance values of the PMOS diode 3 and the NMOS transistor 4 can be adjusted such that no input potential of the detecting amplifier is unnecessarily lower than the inverted potential of the inverter 5.

When an integrated circuit is manufactured, there is a case in which a formed semiconductor memory array is constructed by memory transistors mainly having low or high turning-on resistance values in accordance with a change in wafer. Therefore, a dummy detecting amplifying section 12 is disposed in the detecting amplifier 1 and is constructed by a circuit structure approximately similar to that of the above detecting amplifying section. This dummy detecting amplifying section 12 is disposed to automatically adjust the resistance value of a load of the PMOS transistor 9 such that the potential level of an output signal of the above inverter 11 is stably high or low even when the semiconductor memory array is constructed by memory transistors mainly having low or high turning-on resistance values.

An input side of the dummy detecting amplifying section 12 is connected to an output side of a dummy selecting section 14 connected to an output side of a dummy memory array section 13. The dummy memory array section 13 is constructed by a well-known semiconductor memory array and has a circuit structure similar to that of the above memory array section 51. The dummy memory array section 13 are constructed by only memory transistors having low turning-on resistance values. The dummy selecting section 14 has the same circuit structure as the above selecting section 52. The dummy memory array section 13 and the dummy selecting section 14 are connected to a decoding section as shown in FIG. 2. A circuit structure including the dummy memory array section 13 and the dummy selecting section 14 constitutes a dummy semiconductor memory means 601.

Similar to the above detecting amplifying section, the dummy detecting amplifying section 12 is constructed as follows.

Namely, an input side of the dummy detecting amplifying section 12 is connected to a source side of an NMOS transistor 17. A drain side of the NMOS transistor 17 is connected in series to a P-channel MOS diode (or transistor) 16. The P-channel MOS diode is called a PMOS diode in the following description. A source side of the PMOS diode 16 is connected to a positive power source 15. Similar to the above PMOS diode 3, a turning-on resistance value of the PMOS diode 16 is set to be low.

The input side of the above dummy detecting amplifying section 12 is also connected to an input side of an inverter 18 connected in series to an inverter 19. The input side of the dummy detecting amplifying section 12 is also connected to a drain side of an NMOS transistor 20. A source side of the NMOS transistor 20 is connected to the ground. A gate of the NMOS transistor 20 is connected to an output side of the above inverter 19.

A connection point between the PMOS diode 16 and the NMOS transistor 17 is connected to a gate of the PMOS diode 16 and a gate of a PMOS transistor 22. A source side of the PMOS transistor 22 is connected to a positive power source 21. A turning-on resistance value of the PMOS transistor 22 may be different from that of the PMOS diode 16, but is preferably set to be equal to or greater than the turning-on resistance value of the PMOS diode 16.

A drain side of the PMOS transistor 22 is connected in series to a drain side of an NMOS transistor 23. A source side of the NMOS transistor 23 is connected to the ground. The drain side of the NMOS transistor 23 is connected to gates of the NMOS transistor 23 and the NMOS transistor 10 mentioned above.

An operation of the detecting amplifier 1 constructed above will next be explained.

The inverter 5 and the NMOS transistor 4 are operated such that an input side potential of the detecting amplifying section is constant. Namely, the NMOS transistor 4 is turned off and on as mentioned above by a high or low resistance of a memory transistor selected from memory transistors constituting the memory array section 51. Further, as mentioned above, the PMOS diode 3 and the PMOS transistor 9 constitute a current mirror structure.

Accordingly, when the selected memory transistor has a high resistance, the NMOS transistor 4 is turned off so that no electric current almost or completely flows through the PMOS diode 3 and the PMOS transistor 9. Therefore, an input side potential of the inverter 11 is set to a low level so that an electric signal having a high potential level is transmitted from the inverter 11 to the output section.

In contrast to this, when the memory transistor has a low resistance or is turned on, the NMOS transistor 4 is turned on and this turning-on state is held by an action of the inverter 5. Accordingly, the input side of the detecting amplifying section has an electric potential determined by a turning-on electric current flowing through the PMOS diode 3 and the NMOS transistor 4. Since the above current mirror structure is used, a negative feedback resistance value of the inverter 5 through the NMOS transistor 4 can be reduced by reducing a turning-on resistance value of the PMOS diode 3. Accordingly, an electric current can flow through the PMOS diode 3 from the positive power source 2 at a high speed.

Therefore, when the memory transistor having a low resistance is selected and the next selected memory transistor has a high resistance or is turned off, it is possible to solve the above-mentioned problem about the general detecting amplifier that no detecting amplifier is normally operated until the input side potential of the detecting amplifier is recovered. Accordingly, the input side potential of the detecting amplifier can be constantly held for a very short time without separately requiring any clock signal as in the general detecting amplifier, thereby performing an accessing operation at a high speed.

When the selected memory transistor has a low resistance, an electric current flows through the PMOS diode 3 so that an electric current also flows through the PMOS transistor 9 by the current mirror structure. Therefore, the input side potential of the inverter 11 is set to a high level so that an electric signal having a low potential level is transmitted from the inverter 11 to the output section.

As mentioned above, when the above detecting amplifier is operated, no output side potential of the inverter 5 is normally equal to or smaller than an electric potential provided by adding a threshold voltage of the NMOS transistor 4 to an inverted potential of the inverter 5 for the above-mentioned operating period. However, there is a case in which the output side potential of the inverter 5 is reduced and is smaller than the above added potential when noises in a positive direction are inputted onto the input side of the detecting amplifier.

In such a case, as mentioned above, an inverted potential of the inverter 6 is set to an intermediate potential between the inverted potential of the inverter 5 and a potential provided by adding the threshold voltage of the NMOS transistor 4 to this inverted potential of the inverter 5. Accordingly, when the above noises are inputted to the input side of the detecting amplifier, an output side of the inverter 6 is set to have a high potential level so that the NMOS transistor 7 is turned on. Therefore, an electric potential in the input section of the detecting amplifying section is reduced and the above noises are removed from this input section. When the output side potential of the inverter 5 is increased, an output side potential of the inverter 6 is changed to a low level so that the NMOS transistor 7 is turned off.

As mentioned above, input resistance of the detecting amplifying section is reduced and the above noises can be rapidly removed from the detecting amplifying section by disposing the inverter 6 and controlling a gate voltage of the NMOS transistor 7 when the noises in the positive direction are inputted to the detecting amplifier.

Accordingly, the NMOS transistor 4 is stably operated so that the potential level of an electric signal transmitted from the inverter 11 to the output section can be rapidly stabilized.

Since the dummy detecting amplifying section 12 is disposed, an electric current value of the detecting amplifying section in the output section thereof can be simulated when a selected memory transistor has a low turning-on resistance value. Namely, the turning-on resistance value of the selected memory transistor is low in the dummy detecting amplifying section 12 so that an electric current flows through the PMOS transistor 22 as mentioned above. Accordingly, the NMOS transistor 23 is turned on so that an electric current proportional to the electric current flowing through the NMOS transistor 23 flows through the NMOS transistor 10 constituting a current mirror structure together with the NMOS transistor 23. Therefore, the value of an electric current flowing through the PMOS transistor 9 can be set to be proportional to a value of the electric current flowing through the PMOS transistor 22 in the dummy detecting amplifying section.

As mentioned above, when the memory array section 51 has a low turning-on resistance value in accordance with a manufacturing condition thereof, an amount of the electric current flowing through the PMOS transistor 9 can be correspondingly adjusted and reduced automatically. In contrast to this, when the memory array section 51 has a high turning-on resistance value, the amount of the electric current flowing through the PMOS transistor 9 can be automatically adjusted and increased.

Therefore, an electric signal having a stable high or low potential level is supplied to the input side of the inverter 11 so that no signal having an error in output level is transmitted from the detecting amplifier 1.

Accordingly, the normal operation of the detecting amplifier 1 is secured so that reliability in operation of a memory circuit can be improved.

Further, since the dummy detecting amplifying section 12 is disposed, there is a detecting limit of the detecting amplifier by dispersion in turning-on electric current of a memory transistor in the memory array section 51 in accordance with a manufacturing condition of the detecting amplifier. This detecting limit is changed by an automatic correction function of the detecting amplifier such that dependence of the detecting limit on an absolute error is changed to that on a relative error. Accordingly, yield of products of the detecting amplifier is improved so that reliability in operation of the detecting amplifier is improved.

A second embodiment of the present invention will next be described.

As mentioned above, a turning-on resistance of the PMOS diode 3 shown in FIG. 6 can be reduced by using the circuit construction explained in the first embodiment. However, this reduction in the turning-on resistance is limited by the limit of a current mirror operation of the PMOS diode 3 and the PMOS transistor 9. For example, the turning-on electric current of a memory transistor in the memory array section 51 is reduced in the case of a low voltage operation in which a power voltage is set to 2 to 3.6 volts. However, in this case, a voltage drop in the PMOS diode 3 required to perform the current mirror operation must be constantly maintained. Accordingly, it is necessary to set a turning-on resistance value of the PMOS diode 3 to a value equal to or greater than a certain value. Therefore, in the circuit construction of the detecting amplifier in the first embodiment, it is desirable to perform a precharging operation at a speed equal to or higher than a predetermined speed on output sides of the memory array section 51 and the sequential selecting section 52. In this precharging operation, an electric current is supplied through the above PMOS diode 3 onto a bit line on an input side of the detecting amplifier.

The PMOS diode 3 and the PMOS transistor 9 constitute a current mirror structure. Accordingly, drain impedance of the PMOS transistor 9 is relatively changed in accordance with the turning-on electric current of a memory transistor. At this time, a response speed of the detecting amplifier is almost determined by a gate capacity of each of the PMOS diode 3 and the PMOS transistor 9. Namely, the response speed is decreased as the gate capacity is increased. Accordingly, it is necessary to selectively set a gate channel length of each of these diode and transistor to a minimum length allowed in a manufacturing process thereof.

Figure 11:
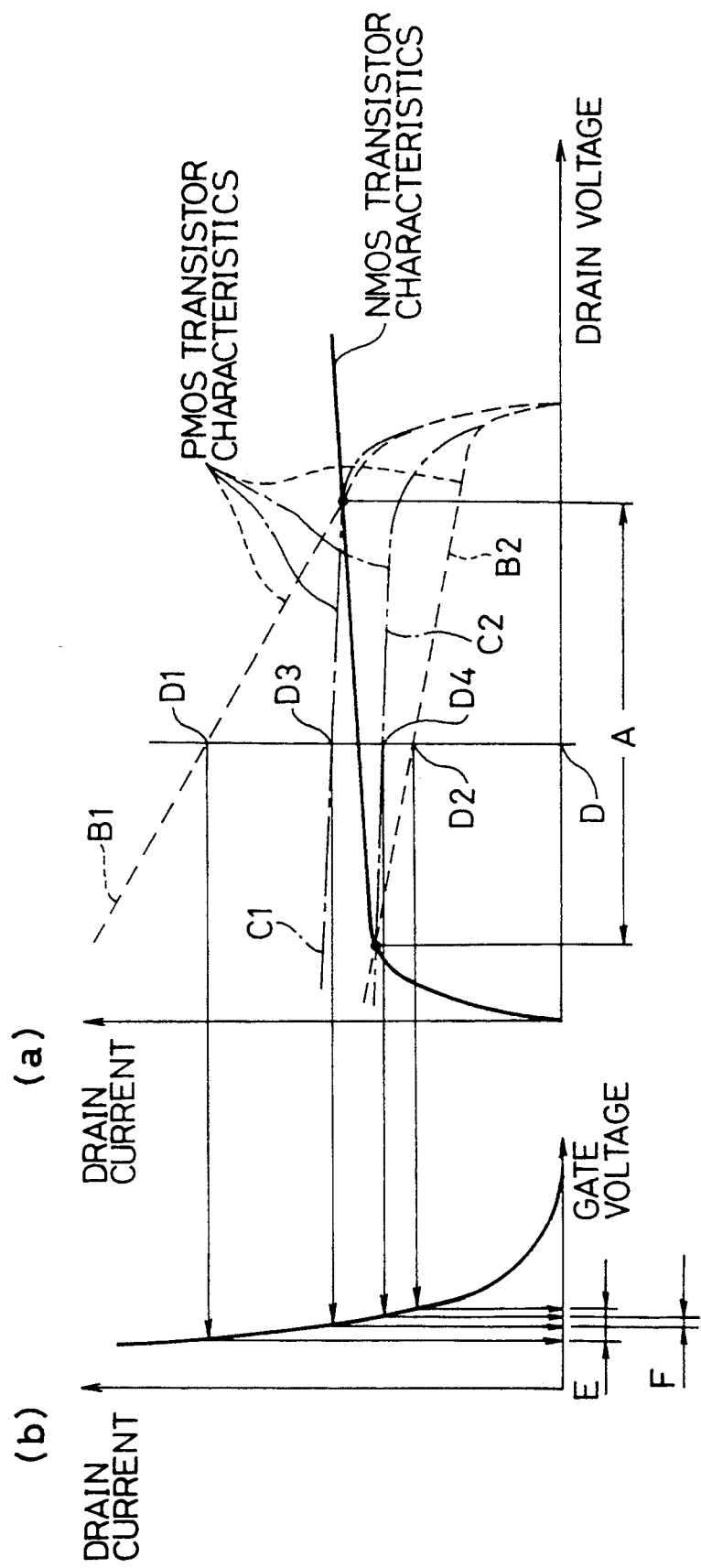
FIG. 11 is a graph showing current characteristics of PMOS and NMOS transistors in an output section of the detecting amplifier.

For example, the turning-on resistance value is reduced by shortening the gate channel length of the PMOS transistor. However, as shown in FIG. 11(a), the inclination of a curve of constant current characteristics of the PMOS transistor 9 in a saturation current region thereof is increased by turning the memory transistor on and off as shown by a dotted line. Different from the PMOS transistor 9, no current characteristics of the NMOS transistor 10 are changed since no channel length of the NMOS transistor 10 is changed. Accordingly, the current characteristics of the NMOS transistor 10 are approximately constant in a saturation current region thereof.

In the first embodiment, as mentioned above, an electric potential at a connection point of the PMOS transistor 9 and NMOS transistor 10 is set to an output of the detecting amplifier. Therefore, as shown by "A" in FIG. 11(a), it is necessary to approximately amplify a drain-source voltage of the PMOS transistor 9 from a ground potential to a positive power potential so as to provide a sufficient logic voltage level on an input side of the inverter 11. Accordingly, when the drain-source voltage is set as shown by "A", the constant current characteristics of the PMOS transistor 9 are provided as shown by curves B1 and B2 of dotted lines when the gate channel length of the PMOS transistor 9 is reduced. For example, when a drain voltage value of the PMOS transistor 9 is set to "D" in FIG. 11(a), a gate voltage of the PMOS transistor 9 is calculated from FIG. 11(b). FIG. 11(b) shows the relation between the gate voltage and the drain current of the PMOS transistor 9.

When the drain voltage value of the PMOS transistor 9 is set to "D", a drain current value of the PMOS transistor 9 is equal to "D1" and "D2" when the current characteristics are provided by curves B1 and B2. As shown in FIG. 11(b), a change in gate voltage of the PMOS transistor 9 at this time is equal to "E".

In contrast to this, when the gate channel length of the PMOS transistor 9 is increased, the current characteristics of the PMOS transistor 9 are provided as shown by curves C1 and C2 of one-dotted chain lines in FIG. 11(a). In such current characteristics, similar to the above case, for example, a drain current value of the PMOS transistor 9 is equal to "D3" and "D4" when the drain voltage value of the PMOS transistor 9 is set to "D". As shown in FIG. 11(b), a change in gate voltage of the PMOS transistor 9 at this time is equal to "F".

As can be seen from FIG. 11(a), the change in drain current value of the PMOS transistor 9 about the respective current characteristics in the case of the long gate channel length is smaller than that in the case of the short gate channel length when the drain voltage value is set to "D".

When the change in output of the detecting amplifier is fixedly set to "A", the change (D3–D4) in drain current of the PMOS transistor 9 having the long gate channel length is smaller than the change (D1–D2) in drain current of the PMOS transistor 9 having the short gate channel length. Accordingly, when the gate channel length is reduced, a current-to-voltage amplification factor of the PMOS transistor 9 is reduced. Namely, the current-to-voltage amplification factor of the PMOS transistor 9 is decreased and increased when an operational speed of the PMOS transistor 9 is increased and decreased, respectively.

A detecting amplifier in the second embodiment can solve these problems so that it is possible to get access to a memory transistor at a higher speed by precharging a bit line at a higher speed and detecting accuracy of the detecting amplifier is improved by increasing the current-to-voltage amplification factor.

Figure 7:
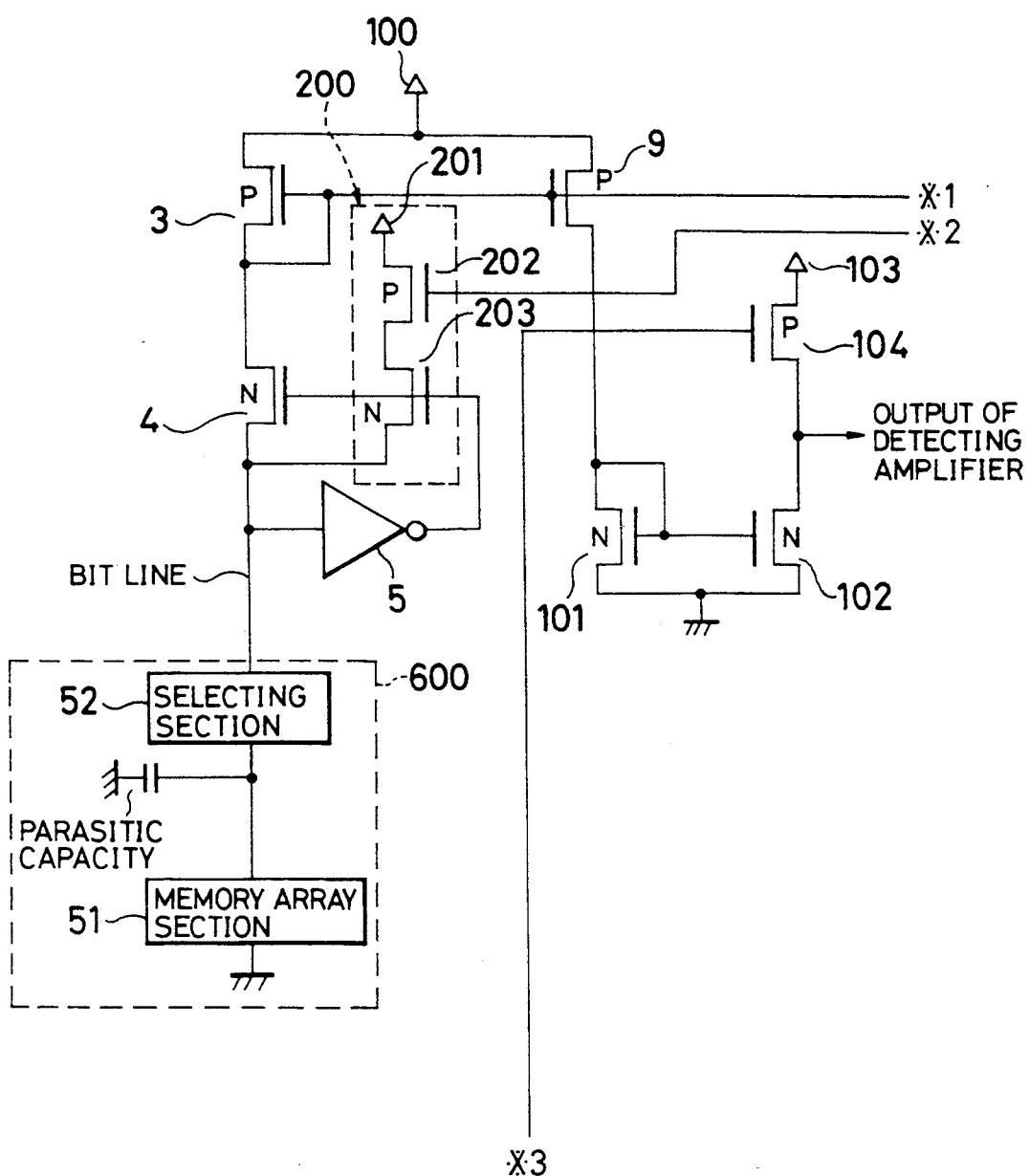
FIG. 7 is a circuit diagram showing a portion of the construction of a detecting amplifier in accordance with a second embodiment of the present invention.
Figure 8:
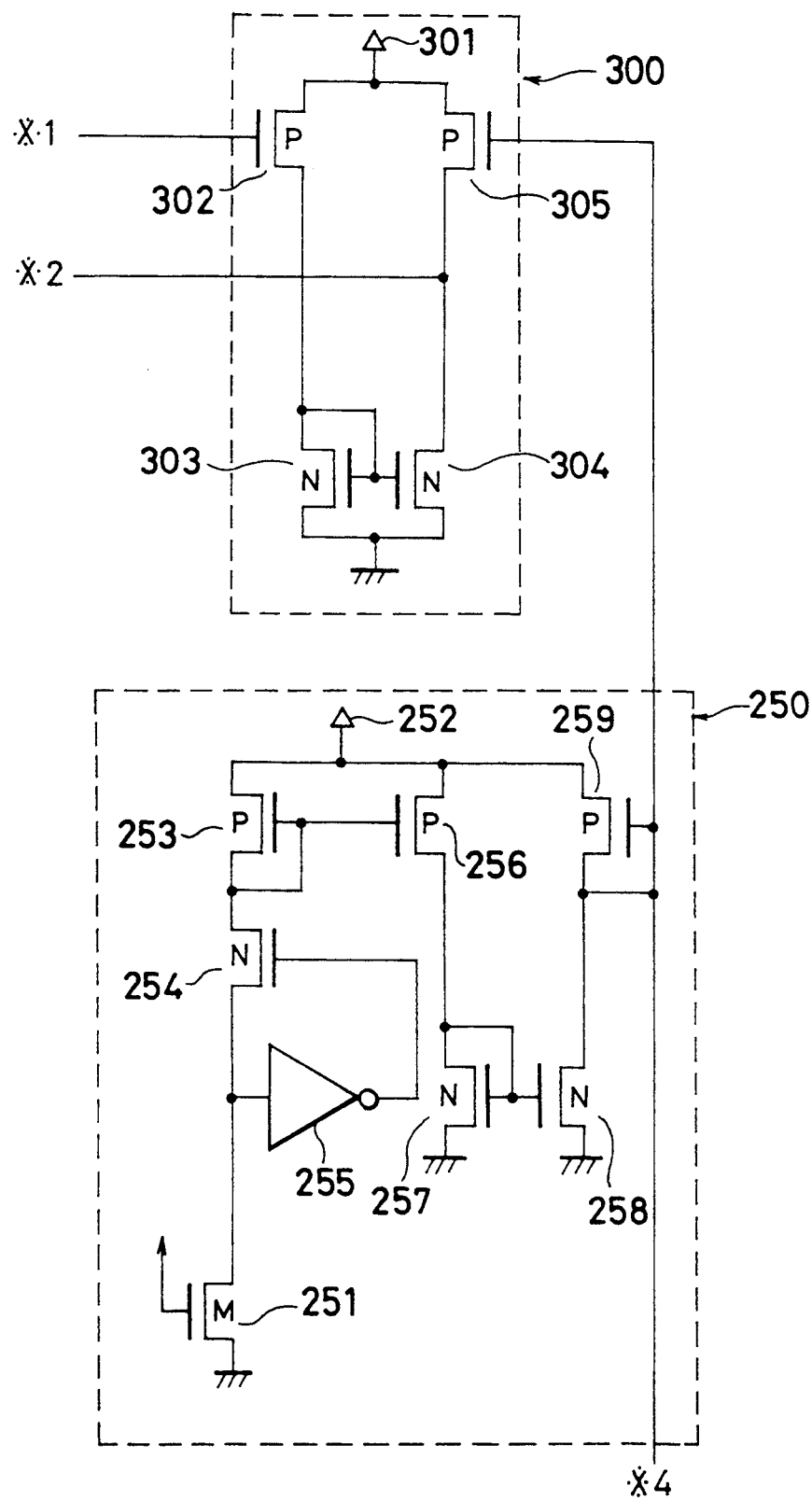
FIG. 8 is a circuit diagram showing another constructional portion of the detecting amplifier in the second embodiment of the present invention.
Figure 9:
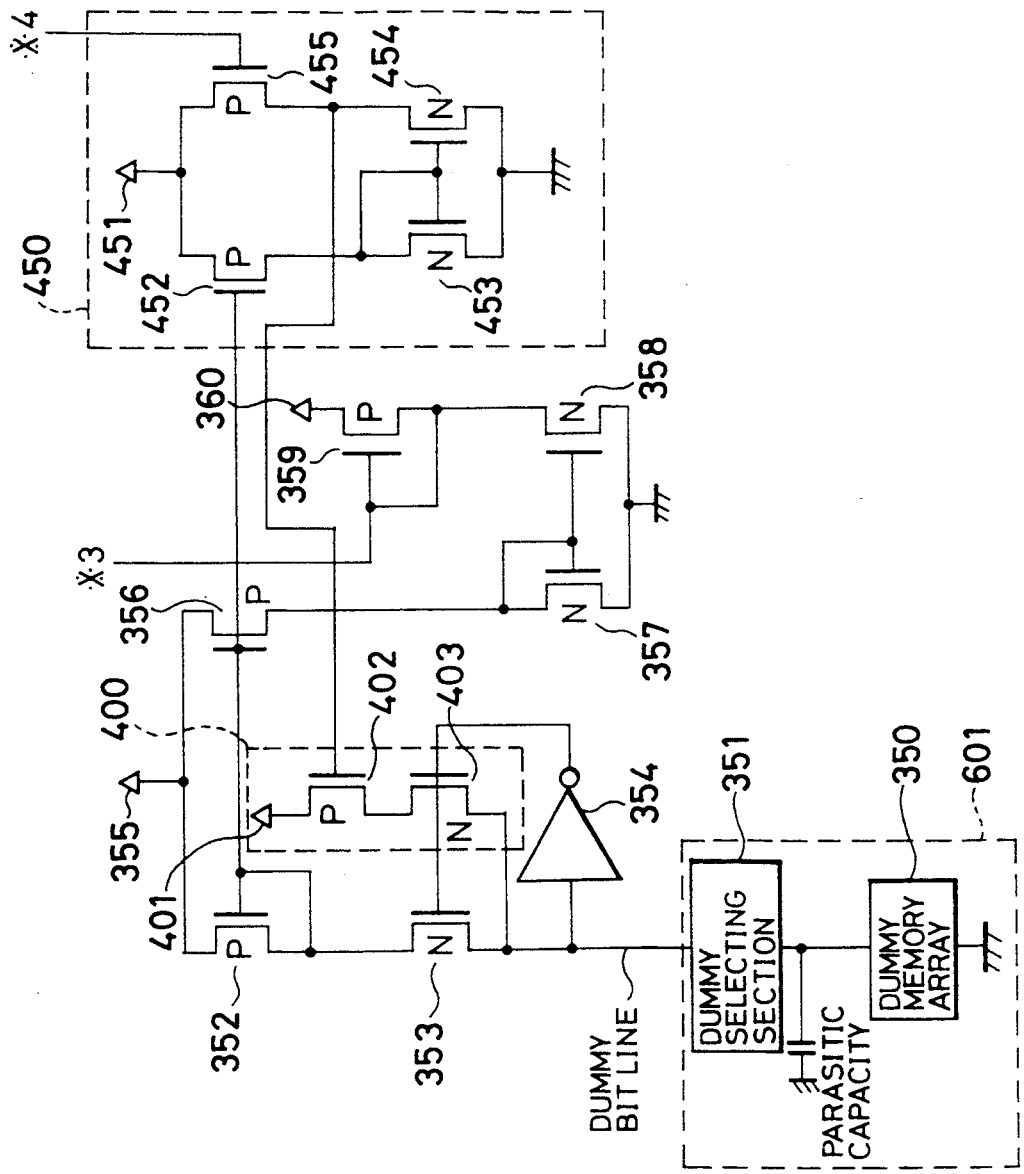
FIG. 9 is a circuit diagram showing another constructional portion of the detecting amplifier in the second embodiment of the present invention.

The detecting amplifier in the second embodiment will next be explained with reference to FIGS. 7 to 9. This detecting amplifier is divisionally shown by FIGS. 7 to 9 since it is difficult to illustrate the entire detecting amplifier by one drawing. Corresponding portions shown by reference numerals *1 to *4 in FIGS. 7 to 9 are respectively connected to each other so that the detecting amplifier is constructed as a whole. In FIGS. 7 to 9, the same constructional portions as FIG. 6 in the first embodiment are designated by the same reference numerals. Therefore, operations, etc. of these constructional portions are similar to those in the above first embodiment and an explanation about these constructional portions is omitted in the following description unless a special description is required for these constructional portions.

Similar to FIG. 6, a source of a PMOS diode 3 is connected to a positive power source 100. A drain of the PMOS diode 3 is connected to a drain of an NMOS transistor 4. A source of the NMOS transistor 4 is connected to an output side of a sequential selecting section 52 connected to a memory array section 51. The output side of the sequential selecting section 52 is connected to a gate of the NMOS transistor 4 through an inverter 5. The drain of the PMOS diode 3 is connected to a gate thereof.

A source of a PMOS transistor 9 is connected to the positive power source 100. A gate of the PMOS transistor 9 is connected to the gate of the PMOS diode 3. The PMOS diode 3 and the PMOS transistor 9 constitute a current mirror structure. A drain of the PMOS transistor 9 is connected to a drain of an NMOS diode 101. The drain of the NMOS diode 101 is connected to a gate thereof. A source of the NMOS diode 101 is connected to the ground. As described later, an output point of the detecting amplifier is set to a connection portion of an NMOS transistor 102 and a PMOS transistor 104 such that an operational speed of the PMOS transistor 9 is increased and a gate channel length of the PMOS transistor 9 is reduced as much as possible.

Figure 12:
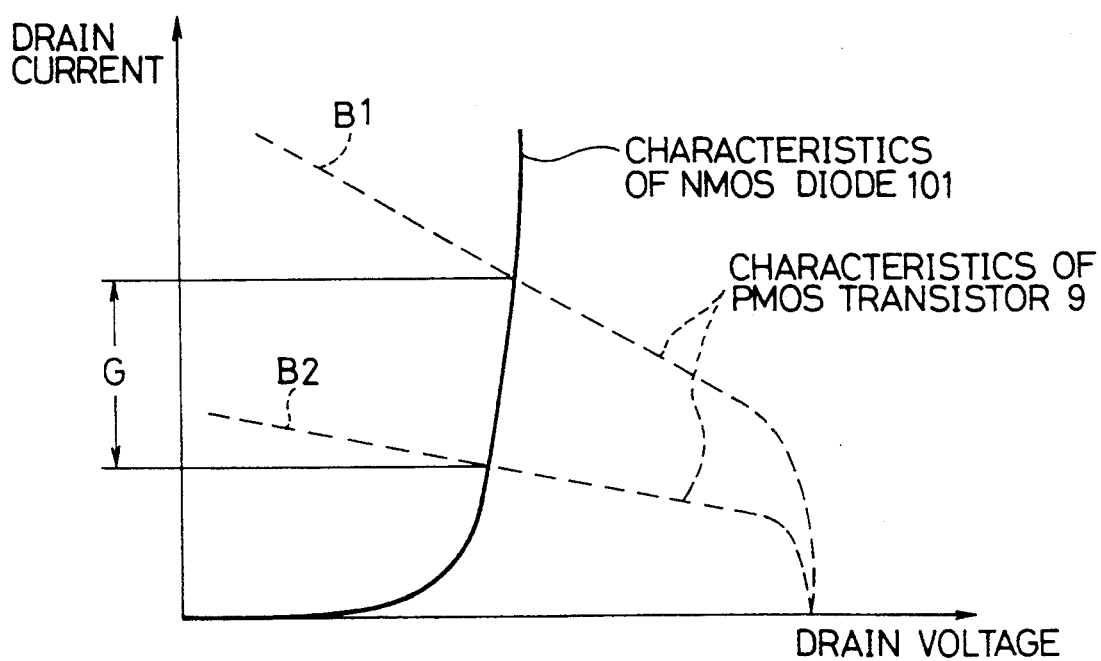
FIG. 12 is a graph showing current characteristics of a PMOS transistor 9 and an NMOS diode 101 shown in FIG. 7.

As mentioned above, the gate channel length of the PMOS transistor 9 is set to be short. Further, the NMOS transistor 10 shown in FIG. 6 is set to the NMOS diode 101 shown in FIG. 7. Accordingly, current characteristics of the PMOS transistor 9 and the NMOS diode 101 are provided as shown in FIG. 12. The current characteristics of the PMOS transistor 9 shown in FIG. 12 are equal to those of the PMOS transistor shown by dotted lines in FIG. 11(a). Therefore, the value of a drain current flowing through a contact portion of the PMOS transistor 9 and the NMOS diode 101 is calculated from an intersecting point of curves showing the current characteristics of the PMOS transistor 9 and the NMOS diode 101. A change in this drain current value is provided as shown by "G" in FIG. 12. The drain of the NMOS diode 101 is connected to the gate thereof so that the current characteristics of the NMOS diode 101 are shown by a curve having a steep rise. Accordingly, the above change "G" in the drain current value is increased in comparison with a simple resistance load.

Figure 10:
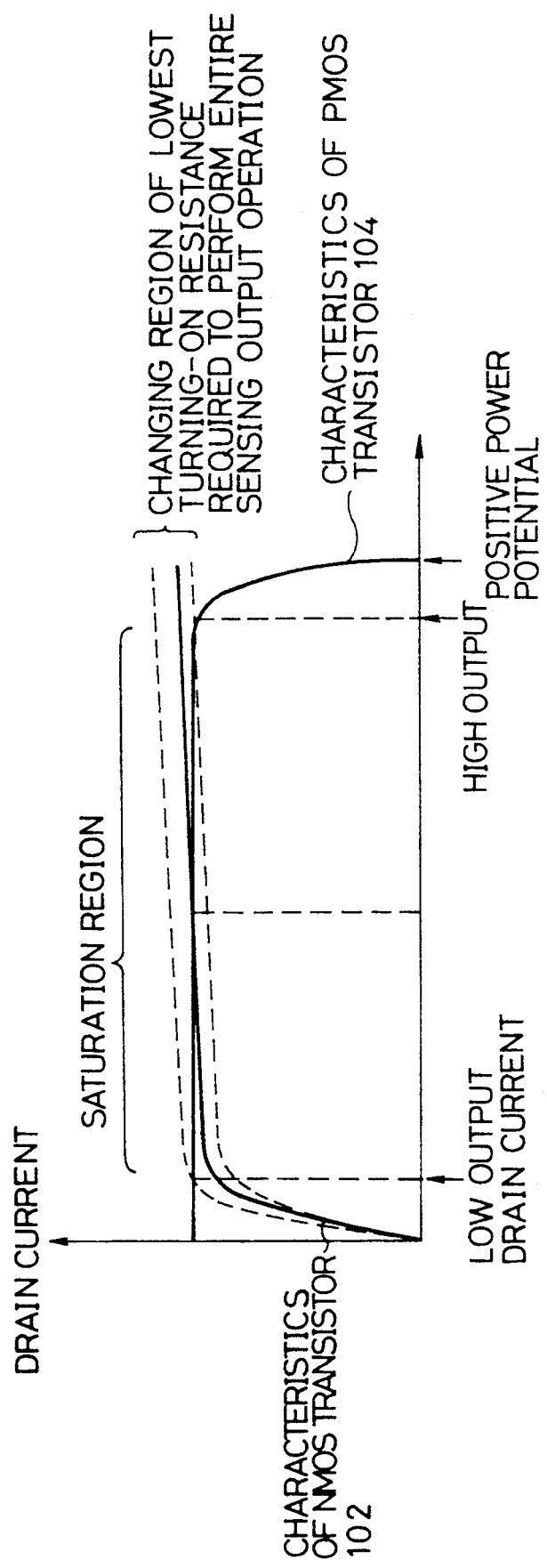
FIG. 10 is a graph showing current characteristics of an NMOS transistor 102 and a PMOS transistor 104 shown in FIG. 7.

A source of a PMOS transistor 104 is connected to a positive power source 103. A drain of the PMOS transistor 104 is connected to an output terminal of the detecting amplifier in this second embodiment and a drain of the NMOS transistor 102. No PMOS transistor 104 relates to a precharging operation on the above bit line. Accordingly, it is not necessary to restrain and set a turning-on resistance value of the PMOS transistor 104 to be low so that it is not necessary to reduce a channel length of the PMOS transistor 104. Therefore, as shown in FIG. 10, drain current characteristics of the PMOS transistor 104 with respect to a drain voltage can be approximately shown by a flat curve in a saturation current region. Current characteristics of the NMOS transistor 102 are approximately shown by a flat curve. Accordingly, for example, a change in gate voltage of the PMOS transistor 104 can be reduced as shown by "F" in FIG. 11(b). A current-to-voltage amplification factor of the detecting amplifier can be improved by setting a connection point of the PMOS transistor 104 and the NMOS transistor 102 to the output terminal of the detecting amplifier. When the current-to-voltage amplification factor is improved, detecting ability of the detecting amplifier is improved with respect to dispersion in turning-on current of a memory transistor so that yield of products is improved. Thus, it is possible to improve reliability in operation of products of the detecting amplifier.

A gate of the NMOS transistor 102 is connected to the gate of the NMOS diode 101. The NMOS diode 101 and the NMOS transistor 102 constitute a current mirror structure. A source of the NMOS transistor 102 is connected to the ground.

A source of the PMOS transistor 202 is connected to a positive power source 201. A turning-on resistance value of the PMOS transistor 202 is set to be lower than that of the PMOS diode 3. A drain of the PMOS transistor 202 is connected to a drain of an NMOS transistor 203. A source of the NMOS transistor 203 is connected to a bit line portion between a source of an NMOS transistor 4 and a connection point on an input side of an inverter 5. A gate of the NMOS transistor 203 is connected to an output side of the inverter 5.

A current supplying circuit 200 for strengthening precharge is constructed by the positive power source 201, the PMOS transistor 202 and the NMOS transistor 203. This current supplying circuit 200 supplies an electric current onto the above bit line through the PMOS diode 3 when the bit line is precharged. The current supplying circuit 200 also supplies an electric current larger than this supplied electric current onto the above bit line. The current supplying circuit 200 is disposed to perform the precharging operation at a high speed.

In FIG. 8, a reference voltage value transmitting circuit 250, a precharge detecting circuit 300 and the above current supplying circuit 200 relate to the precharging operation on the bit line. As mentioned above, the PMOS diode 3, the PMOS transistor 9 and a PMOS transistor 302 described later constitute current mirror structures. In this embodiment, many current mirror structures are further disposed as described later. At the precharging time, an electric current from a positive power source flows through each of the current mirror structures so that power consumption is increased. The reference voltage value transmitting circuit 250, etc. are used to restrain and set power consumption to be low at the precharging time.

No value of an electric current flowing through the PMOS diode 3 is equal to or greater than a turning-on current value of a memory transistor in an operating state of the detecting amplifier except for a precharging state. Accordingly, start of the precharging operation can be detected by comparing the turning-on current value of the memory transistor transmitted from the reference voltage value transmitting circuit 250 with the value of an electric current flowing through the bit line. Namely, start of the precharging operation can be detected by comparing the turning-on current value of the memory transistor with the value of the electric current flowing through the PMOS diode 3.

The reference voltage value transmitting circuit 250 generates a current value corresponding to the above turning-on current value of the memory transistor. The reference voltage value transmitting circuit 250 supplies a voltage used to detect a reference current having a current value equal to or certain times the turning-on current value of the memory transistor transmitted from an output terminal of the detecting amplifier in FIG. 7. Accordingly, a circuit structure of the reference voltage value transmitting circuit 250 is equal to the circuit structure shown in FIG. 7 except for a connection portion of a memory transistor 251 in a turning-on state connected to an input side of the inverter 5 shown in FIG. 7 and except for the current supplying circuit 200 for strengthening precharge. Electric characteristics of each of electric elements such as a turning-on resistance value are completely set by the same condition when a reference current value shown by an output voltage value of the reference voltage value transmitting circuit 250 is set to be equal to an output current value of the detecting amplifier. In contrast to this, for example, when the output voltage value of the reference voltage value transmitting circuit 250 is set to be certain times a voltage value shown by the output current value of the detecting amplifier, it is sufficient to change a channel width ratio of a PMOS diode 253 and a PMOS transistor 256, or a channel width ratio of an NMOS diode 257 and an NMOS transistor 258.

The circuit structure of the reference voltage value transmitting circuit 250 will next be described briefly. A positive power source 252 in FIG. 8 corresponds to the positive power source 100 in FIG. 7. A PMOS diode 253, an NMOS transistor 254 and an inverter 255 in FIG. 8 respectively correspond to the PMOS diode 3, the NMOS transistor 4 and the inverter 5 in FIG. 7. A PMOS transistor 256, an NMOS diode 257 and an NMOS transistor 258 in FIG. 8 respectively correspond to the PMOS transistor 9, the NMOS diode 101 and the NMOS transistor 102 in FIG. 7. A PMOS transistor 259 in FIG. 8 corresponds to the PMOS transistor 104 in FIG. 7. A drain of the PMOS transistor 259 is connected to a gate thereof and a gate of a PMOS transistor 305 disposed in a precharge detecting circuit and described later. A voltage value transmitted from the drain of the PMOS transistor 259 shows the reference current value provided from the reference voltage value transmitting circuit 250.

The precharge detecting circuit 300 compares the value of an electric current flowing through the PMOS diode 3 with the reference current value provided from the above reference voltage value transmitting circuit 250. The precharge detecting circuit 300 transmits a signal voltage level corresponding to the compared results to the current supplying circuit 200 for strengthening precharge.

The precharge detecting circuit 300 is constructed as follows. Namely, a source of a PMOS transistor (or diode) 302 is connected to a positive power source 301. A gate of the PMOS transistor 302 is connected to the gates of the PMOS diode 3 and the PMOS transistor 9 shown in FIG. 7. Accordingly, the PMOS transistor 302, the PMOS diode 3 and the PMOS transistor 9 constitute current mirror structures. A drain of the PMOS transistor 302 is connected to a drain of an NMOS diode (or transistor) 303. A source of the NMOS diode 303 is connected to the ground. A drain of the NMOS diode 303 is connected to a gate thereof.

Similar to the above circuit structure, a source of a PMOS transistor 305 is connected to the positive power source 301. A gate of the PMOS transistor 305 is connected to an output terminal of the reference voltage value transmitting circuit 250 as mentioned above. Accordingly, the PMOS transistor 305 and the PMOS transistor 259 disposed in the reference voltage value transmitting circuit 250 constitute a current mirror structure. A drain of the PMOS transistor 305 is connected to a drain of an NMOS transistor 304. A source of the NMOS transistor 304 is connected to the ground. A gate of the NMOS transistor 304 is connected to the gate of the NMOS diode 303. Accordingly, the NMOS diode 303 and the NMOS transistor 304 constitute a current mirror structure.

A drain of the PMOS transistor 305 is connected to a gate of the PMOS transistor 202 disposed in the above current supplying circuit 200 for strengthening precharge.

In this precharge detecting circuit 300, the PMOS transistor 302 has a current mirror relation together with the PMOS diode 3, etc. Accordingly, an electric current certain times an electric current flowing through the PMOS diode 3 flows through the PMOS transistor 302.

Further, the NMOS diode 303 and the NMOS transistor 304 in the precharge detecting circuit 300 have a current mirror relation. Accordingly, an electric current certain times an electric current flowing through the NMOS transistor 303 flows through the NMOS transistor 304. Namely, The electric current flowing through the NMOS transistor 304 corresponds to the electric current flowing through the PMOS diode 3.

Further, the PMOS transistor 305 has a current mirror relation together with the PMOS transistor 259 disposed in the reference voltage value transmitting circuit 250. Accordingly, the value of a saturation current flowing through the PMOS transistor 305 is equal to be certain times the above reference current value.

An electric potential of the PMOS transistor 305 on the drain side thereof is equal to an electric potential applied to the gate of the PMOS transistor 202 disposed in the current supplying circuit 200 for strengthening precharge. This applied electric potential is set to a drain voltage determined from drain current characteristics of the PMOS transistor 305 and the NMOS transistor 304 on the basis of the value of a saturation current flowing through the PMOS diode 3. In other words, this applied electric potential is set to a drain voltage determined from drain current characteristics of the PMOS transistor 305 and the NMOS transistor 304 on the basis of the value of a saturation current flowing through the NMOS transistor 304 and the value of a saturation current flowing through the PMOS transistor 305.

The PMOS transistor 202 in the current supplying circuit 200 for strengthening precharge is turned on and off by an output voltage of the precharge detecting circuit 300. Namely, when the value of an electric current flowing through the PMOS diode 3 is larger than the above reference current value, i.e., at a precharging time, the output voltage of the precharge detecting circuit 300 is set to a low voltage level so that the PMOS transistor 202 is turned on. The NMOS transistor 203 is turned on by an output voltage of the inverter 5. Accordingly, an electric current flows from the positive power source 201 through the PMOS transistor 202 and the NMOS transistor 203 to the bit line.

An electric current is supplied from the positive power source 100 to the bit line through the PMOS diode 3. As mentioned above, the PMOS transistor 202 is formed such that a turning-on resistance value of this PMOS transistor 202 is smaller than that of the PMOS diode 3. Accordingly, a large amount of electric currents flow onto the bit line from the positive power source 201. Accordingly, similar to the first embodiment, no precharging operation is performed through only the PMOS diode 3 so that a time required to perform the precharging operation can be further reduced. The amount of an electric current flowing through the PMOS transistor 9 having the current mirror relation together with the PMOS diode 3 is reduced by reducing the time required to perform the precharging operation and bypassing the electric currents.

When the value of the electric current flowing through the PMOS diode 3 is equal to or smaller than the above reference current value, i.e., at a time except for the precharging time, an output voltage of the precharge detecting circuit 300 is set to a high level so that the PMOS transistor 202 is turned off. Accordingly, no electric current flows to the bit line from the positive power source 201.

An operation of the detecting amplifier constructed above will next be explained.

Operations of the NMOS transistor 4 and the inverter 5 are similar to those in the first embodiment. Namely, the NMOS transistor 4 and the inverter 5 are operated such that an electric potential of the detecting amplifier on an input side thereof is constantly maintained. Operations of the PMOS diode 3 and the PMOS transistor 9 are similar to those in the first embodiment. Accordingly, an explanation about the operations of the PMOS diode 3 and the PMOS transistor 9 is omitted in the following description.

In this second embodiment, a gate of the NMOS diode 101 is connected to a drain thereof to construct a MOS diode and this NMOS diode 101 is used as a load. An electric current flows through the PMOS transistor 9 since the PMOS diode 3 and the PMOS transistor 9 have the current mirror relation. Accordingly, an electric current also flows through the NMOS diode 101 so that an electric current flows through the NMOS transistor 102 having the current mirror relation together with the NMOS diode 101.

As described later, a gate of the PMOS transistor 104 is connected to a gate of a PMOS transistor 359 disposed in a detecting amplifier on a dummy side. The PMOS transistors 104 and 359 have a current mirror relation. Therefore, an electric current certain times an electric current flowing through the PMOS transistor 359 flows through the PMOS transistor 104. The gate of the PMOS transistor 104 is connected to the ground when no detecting amplifider on the dummy side is disposed.

Accordingly, an electric potential at a connection point of the PMOS transistor 104 and the NMOS transistor 102 corresponds to a current value determined by the mutual relation in electric characteristics between the electric current flowing through the PMOS transistor 104 and the electric current flowing through the NMOS transistor 102.

The electric current flowing through the PMOS transistor 104 depends on the electric current flowing through the PMOS transistor 359 in the dummy side detecting amplifier. As described later, a dummy memory array is constructed by memory transistors each having a low turning-on resistance value. Accordingly, it is possible to accurately detect an electric current flowing out of a memory transistor selected from the memory array 51 on a normal side from the output terminal of the detecting amplifier in this embodiment even when the selected memory transistor has the low turning-on resistance value.

The PMOS transistor 104 is constructed such that no PMOS transistor 104 relates to the PMOS diode 3 and the PMOS transistor 9 relative to the precharging operation on the above bit line. Accordingly, it is not necessary to restrain and set a turning-on resistance value of the PMOS transistor 104 to be low so that it is not necessary to reduce a channel length of the PMOS transistor 104. Therefore, a curve showing drain current characteristics of the PMOS transistor 104 with respect to a drain voltage thereof can be set to be approximately flat in a saturation current region.

A curve showing drain current characteristics of the NMOS transistor 102 with respect to a drain voltage thereof is flat in a saturation current region in comparison with the PMOS transistor 9. Accordingly, as shown in FIG. 10, an output potential of the detecting amplifier in this embodiment is determined by the two transistors each having drain current characteristics approximately shown by the flat curve in the saturation current region. Therefore, a current-to-voltage amplification factor of the detecting amplifier is improved in comparison with the first embodiment. Accordingly, an accuracy in current detection of the detecting amplifier can be improved since the output potential of the detecting amplifier at an average value of the turning-on current value of a memory transistor is determined by a ratio of widths of a change in current required to perform the entire output operation of the detecting amplifier.

Operations of the current supplying circuit 200 for strengthening precharge, the reference voltage value transmitting circuit 250 and the precharge detecting circuit 300 are briefly explained in the following description since these operations are already described above. Namely, the precharge detecting circuit 300 detects whether the bit line is in a precharging state or not. When the bit line is in the precharging state, an electric current is supplied to the bit line by the current supplying circuit 200 for strengthening precharge.

The operation of the detecting amplifider will next be described when a dummy memory array is further disposed. Constructions of a dummy memory array and other electric circuits relative to this dummy memory array in the second embodiment are similar to those in the first embodiment to improve an accuracy in detecting operation of the detecting amplifier. No reference voltage value transmitting circuit 250 is separately disposed since there is no problem about the detecting amplifier when the reference current value is commonly used.

A detecting amplifier for performing a detecting operation of the dummy memory array is called a dummy side detecting amplifier. In contrast to this, the detecting amplifier for performing a detecting operation of the above normal memory array is called a normal side detecting amplifier.

Constructional circuits on the dummy side will next be explained with reference to FIG. 9. It should be easily understood from FIG. 9 that the connecting relations, etc. of constructional elements on the dummy side are completely equal to those in the first embodiment. Accordingly, a detailed explanation about these connecting relations, etc. is omitted and only corresponding relations of these elements will be explained in the following description.

In FIGS. 7 and 9, a dummy memory array section 350 corresponds to the memory array section 51. Each of memory transistors constituting the dummy memory array section 350 has a low turning-on resistance value. A dummy sequential selecting section 351 corresponds to the sequential selecting section 52. A positive power source 355 corresponds to the positive power source 100. A PMOS diode 352, an NMOS transistor 353 and a PMOS transistor 356 respectively correspond to the PMOS diode 3, the NMOS transistor 4 and the PMOS transistor 9. An NMOS diode 357 and an NMOS transistor 358 respectively correspond to the NMOS diode 101 and the NMOS transistor 102. Further, a positive power source 360 and a PMOS transistor 359 respectively correspond to the positive power source 103 and the PMOS transistor 104.

Gates of the PMOS transistors 104 and 359 are connected to each other. The PMOS transistors 104 and 359 have a current mirror relation. The gate of the PMOS transistor 359 is connected to a drain thereof.

A dummy side current supplying circuit 400 for strengthening precharge corresponds to the current supplying circuit 200 for strengthening precharge. In these current supplying circuits, a positive power source 401, a PMOS transistor 402 and an NMOS transistor 403 respectively correspond to the positive power source 201, the PMOS transistor 202 and the NMOS transistor 203.

In FIGS. 7 and 9, a dummy side precharge detecting circuit 450 corresponds to the precharge detecting circuit 300. In these precharge detecting circuits, a positive power source 451, a PMOS transistor 452 and an NMOS diode 453 respectively correspond to the positive power source 301, the PMOS transistor 302 and the NMOS diode 303. Further, an NMOS transistor 454 and a PMOS transistor 455 respectively correspond to the NMOS transistor 304 and the PMOS transistor 305.

A gate of the PMOS transistor 452 is connected to gates of the PMOS diode 352 and the PMOS transistor 356. The PMOS transistors 452, 352 and 356 have current mirror relations. A drain of the PMOS transistor 455 is connected to a gate of the PMOS transistor 402. A gate of the PMOS transistor 455 is connected to an output terminal of the reference voltage value transmitting circuit 250 shown in FIG. 8.

An operation of this detecting amplifier constructed by the dummy memory array section 350, etc. will next be explained. A dummy memory transistor corresponding to a memory transistor selected in the memory array section 51 is selected from the dummy memory array section 350. A sensing operation of the selected dummy memory transistor is similar to the above-mentioned sensing operation. In this case, the PMOS transistor 359 on the dummy side and the PMOS transistor 104 on the normal side have a current mirror relation. Accordingly, an electric current certain times an electric current flowing through the PMOS transistor 359 flows through the PMOS transistor 104. Accordingly, as explained in the above first embodiment, the PMOS transistor 359 is operated such that an accurate detecting output value is reliably outputted from the detecting amplifier on the normal side even when a memory transistor having a low turning-on resistance value is selected by the memory array section 51 on the normal side.

The electric current flowing through the PMOS transistor 104 is preferably set to be about 0.5 times the electric current flowing through the PMOS transistor 359.

Similar to the above-mentioned operation of the normal side detecting amplifier, the precharge detecting circuit 450 detects the precharging time of a bit line in the dummy memory array section 350 and an electric current is supplied to the dummy side bit line from the dummy side current supplying circuit 400 for strengthening precharge.

In the second embodiment, the positive power sources 100, 103, etc. are separately arranged as mentioned above. Otherwise, a common electric circuit for constructing these power sources may be disposed.

A third embodiment of the present invention will next be described.

In the above first and second embodiments, an electric current flowing from an output section of the detecting amplifier is determined by an intersecting point of curves showing drain current characteristics of the PMOS transistor 9 and the NMOS transistor 10 in the case of FIG. 6. The electric current flowing from the output section of the detecting amplifier is determined by an intersecting point of curves showing drain current characteristics of the PMOS transistor 104 and the NMOS transistor 102 in the case of FIG. 7. Each of drain currents of the NMOS transistors 10 and 102 as a reference for judging data value "0" or "1" in the output section of the detecting amplifier is approximately set to be half a maximum value of each of drain currents flowing through the PMOS transistors 9 and 104 such that this reference value is not set to only one of "0" and "1". A normal detecting amplifying section is connected to the semiconductor memory 600 and a dummy detecting amplifying section is connected to the dummy semiconductor memory 601 such that each of the drain currents of the NMOS transistors 10 and 102 is approximately set to be half the maximum value. The ratios of sizes of transistors constituting the respective current mirror structures are adjusted to provide the above connections of the normal and dummy detecting amplifying sections. For example, the ratios of sizes of the PMOS transistors 3 and 9, the PMOS transistors 16 and 22, and the NMOS transistors 10 and 23 are adjusted in the detecting amplifier shown in FIG. 6.

As mentioned above, each of the dummy memory array sections 13 and 350 shown in FIGS. 6 and 9 is constructed by only transistors each having a low turning-on resistance value. For example, this construction is used on the basis of a premise that no leak current flows from a transistor having a high turning-on resistance value and constituting the memory array section 51 of the semiconductor memory 600 shown in FIG. 6. In the first and second embodiments, the above ratios of sizes of the transistors constituting the current mirror structures are set to ½ such that, for example, an electric current of the NMOS transistor 10 is equal to be half an electric current of the PMOS transistor 9 obtained by a turning-on current provided when a transistor having a low turning-on resistance value selected.

Figure 19:
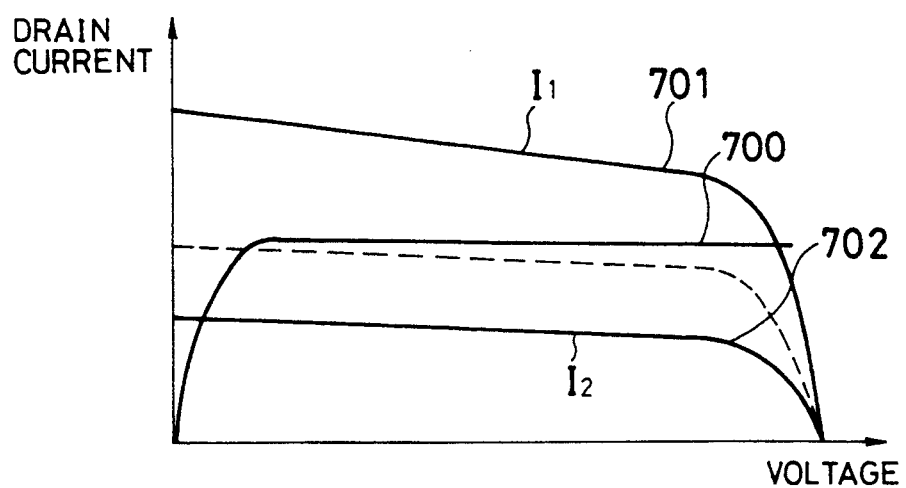
FIG. 19 is a graph showing current characteristics of selected memory transistors having low and high region resistance values and the characteristics of a reference electric current flowing through an NMOS transistor 10.

However, in reality, there is a case in which a voltage equal to or higher than a threshold voltage of a transistor having a high turning-on resistance value and constituting the memory array section 51 is applied to a gate of this transistor. In such a case, a leak current flows from this transistor having the high turning-on resistance value. For example, as shown in FIG. 19, when such a leak current flows, a drain current of the NMOS transistor 10 shown by characteristic curve 700 is set to be half a drain current of the PMOS transistor 9 shown by characteristic curve 701 in the case of the selection of a memory transistor having a low turning-on resistance value. At this time, a drain current of the PMOS transistor 9 shown by characteristic curve 702 approaches the current characteristic curve 700 as shown by a dotted line in the case of the selection of a memory transistor having a high turning-on resistance value. Therefore, it is difficult to judge data value "0" or "1" in the output section of the detecting amplifier so that there is a case in which this judgment is made in error. Accordingly, it is necessary to consider the above leak current so as to improve an accuracy in detection of the detecting amplifier. In a detecting amplifier in accordance with the third embodiment, the detecting accuracy is improved in consideration of the above leak current. A construction and an operation of the detecting amplifier in the third embodiment will next be explained.

In this patent specification and drawings, a low region resistance value means a low turning-on resistance value and a high region resistance value means a high turning-on resistance value.

A leak current means an electric current flowing through a memory transistor having a high turning-on resistance value. A turning-on current means an electric current flowing through a memory transistor having a low turning-on resistance value.

The following description relates to a case in which electric circuits in the third embodiment are applied to the first embodiment. However, the electric circuits in the third embodiment can be also applied to the second embodiment.

Figure 13:
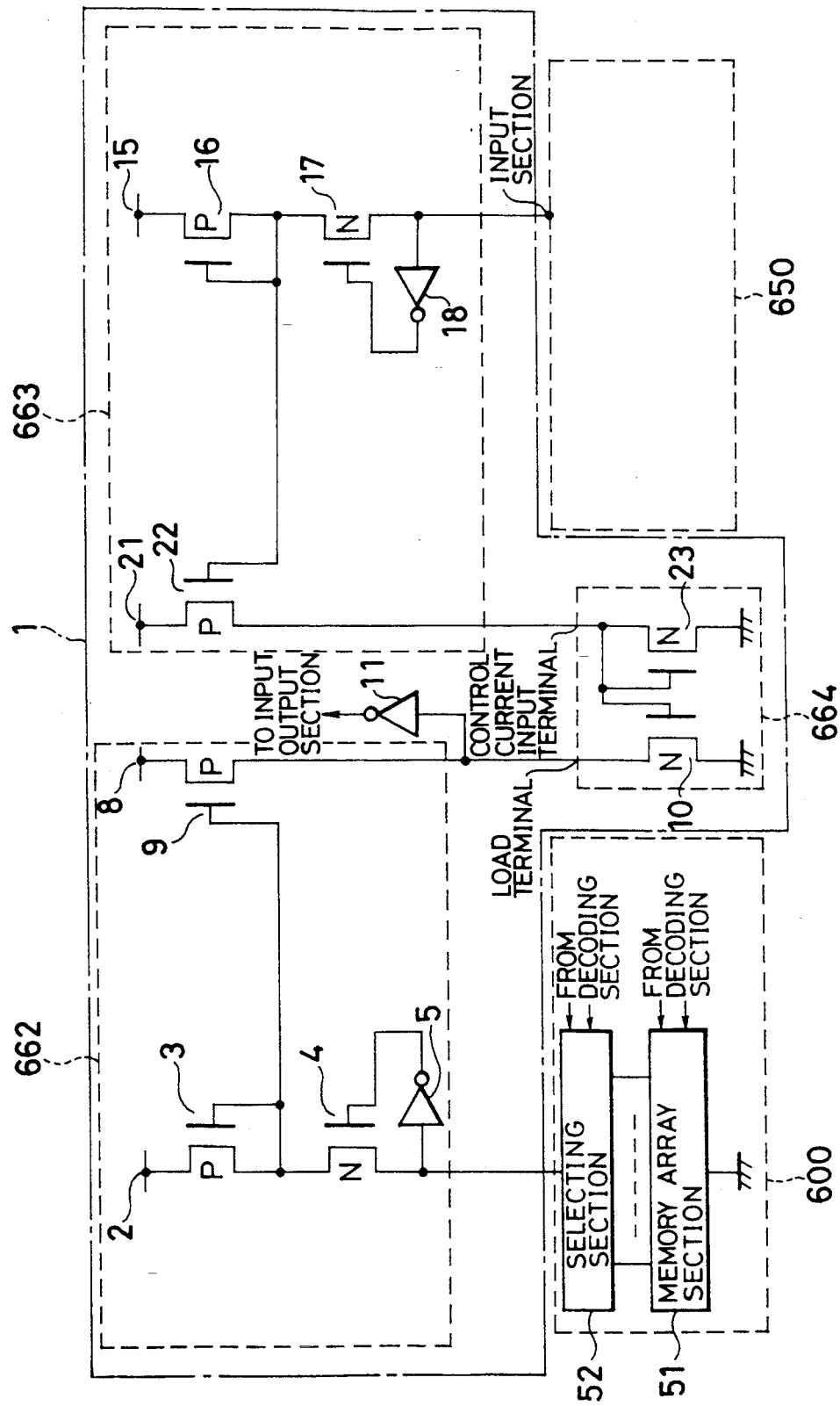
FIG. 13 is a circuit diagram showing the construction of a detecting amplifier in accordance with a third embodiment of the present invention.

FIG. 13 schematically shows the construction of a detecting amplifier in accordance with the third embodiment. The same constructional portions as FIG. 6 are designated by the same reference numerals and an explanation about these constructional portions is omitted in the following description.

In this third embodiment, a comparing current generator 650 instead of the dummy semiconductor memory 601 shown in FIG. 6 is connected to an input section of a dummy detecting amplifying section 12. The comparing current generator 650 supplies an electric current to this input section and this electric current has a current value set such that a reference current provided in consideration of the above leak current is applied to a gate of an NMOS transistor 10 or 102. A concrete circuit construction of the comparing current comparator 650 will next be described.

Figure 14:
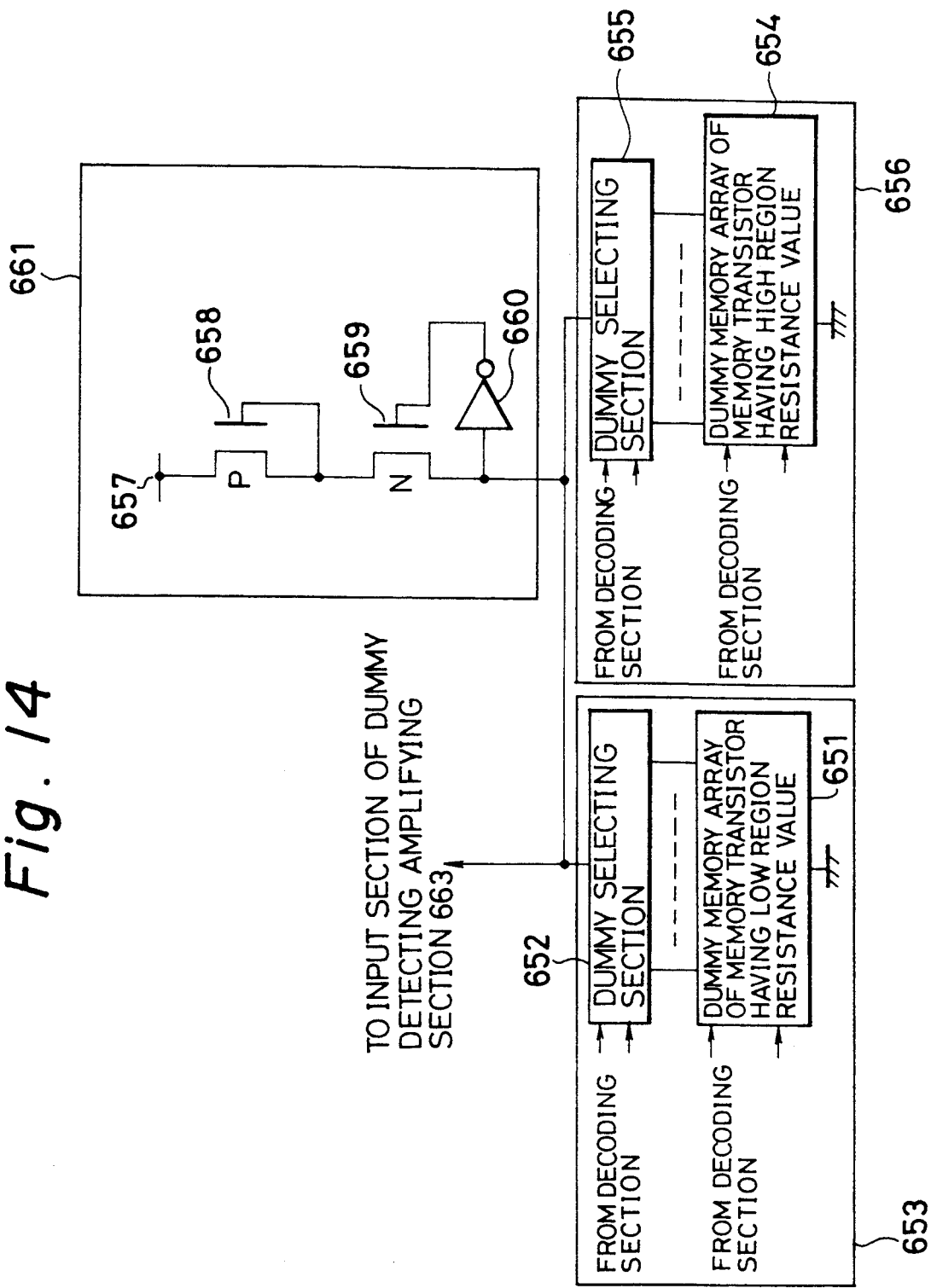
FIG. 14 is a block diagram showing one example of a comparing current generating means shown in FIG. 13.

FIG. 14 shows one example of the concrete circuit construction of the comparing current comparator 650. In FIG. 14, the comparing current comparator 650 is constructed by dummy semiconductor memories 653, 656 and a flow dividing circuit 661.

A maximum electric current flows through the dummy semiconductor memory 653. The dummy semiconductor memory 653 has a dummy memory transistor array 651 including a memory transistor having a low turning-on resistance value as shown in FIG. 6 and has a dummy selecting section 652 for the dummy memory transistor array 651. An output side of the dummy selecting section 652 is connected to an input section of a dummy detecting amplifying section 663 shown in FIG. 13.

A minimum electric current flows through the dummy semiconductor memory 656. The dummy semiconductor memory 656 has a dummy memory transistor array 654 including a memory transistor having a high turning-on resistance value and has a dummy selecting section 655 for the dummy memory transistor array 654. An output side of the dummy selecting section 655 is connected to the output side of the above dummy selecting section 652.

Figure 15:
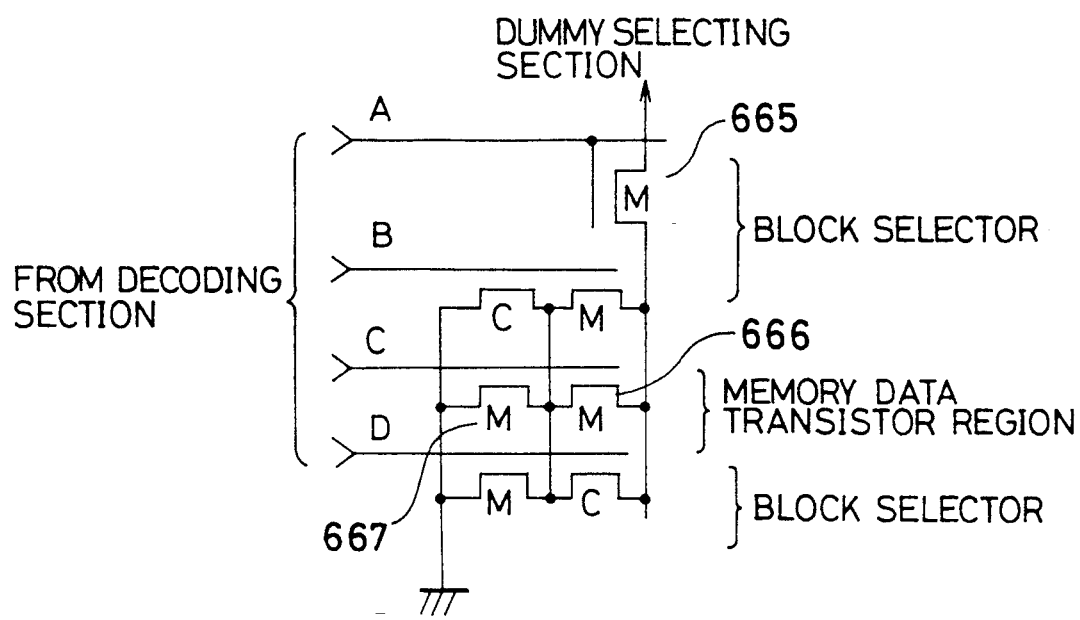
FIG. 15 is a circuit diagram showing one example of a dummy memory array of memory transistors each having a low region resistance value and shown in FIG. 14.
Figure 16:
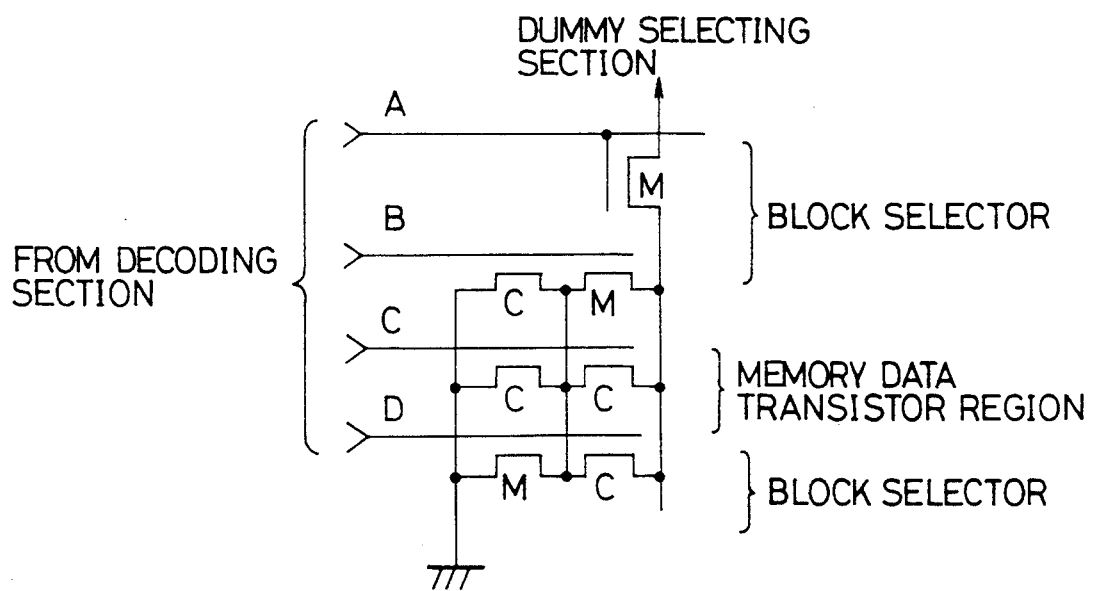
FIG. 16 is a circuit diagram showing another example of the dummy memory array of memory transistors each having a low region resistance value and shown in FIG. 14.

FIG. 15 shows a concrete circuit construction of the dummy memory transistor array 651 including a memory transistor having a low turning-on resistance value within the dummy semiconductor memory 653. FIG. 16 shows a concrete circuit construction of the dummy memory transistor array 654 including a memory transistor having a high turning-on resistance value within the dummy semiconductor memory 656. Each of these circuit constructions in FIGS. 15 and 16 is similar to that in the case of a general semiconductor memory. Therefore, an explanation about these circuit constructions is omitted in the following description. In FIGS. 15 and 16, a transistor shown by reference numeral M shows a transistor having a low region resistance value. Further, a transistor shown by reference numeral C shows a transistor having a high region resistance value.

In FIGS. 15 and 16, when a line element portion A has a high voltage value, a memory block indicated by this line element portion A is selected. When a line element portion C has a high voltage value, a memory data transistor region is selected. When a line element portion B has a high voltage value and a line element portion D has a low voltage value, a left-hand memory transistor in the above memory data transistor region in each of FIGS. 15 and 16 is selected. In contrast to this, when the line element portion B has a low voltage value and the line element portion D has a high voltage value, a right-hand memory transistor in the above memory data transistor region in each of FIGS. 15 and 16 is selected.

The flow dividing circuit 661 is constructed by the same circuit structure as an electric circuit composed of a positive power source 15 PMOS transistor 16, an NMOS transistor 17 and an inverter 18. This electric circuit is obtained by removing a positive power source 21 and a PMOS transistor 22 from the circuit construction of the dummy detecting amplifying section 663 connected to the above dummy semiconductor memory 653. Concretely, the flow dividing circuit 661 is constructed by a positive power source 657, a PMOS transistor 658, an NMOS transistor 659 and an inverter 660. The flow dividing circuit 661 has a resistance value equivalent to that of an electric circuit composed of the positive power source 15, the PMOS transistor 16, the NMOS transistor 17 and the inverter 18 in the above dummy detecting amplifying section 663. An output side of the dummy selecting section 655 of the dummy semiconductor memory 656 is connected to a source of the NMOS transistor 659.

An operation of the comparing current generator 650 constructed by the dummy semiconductor memories 653, 656 and the flow dividing circuit 661 will next be described.

In the following description, $i_2$ is set to a turning-on current value of a memory transistor having a low region resistance value and including a leak current. $i_1$ is set to a turning-on current value of a memory transistor having a high region resistance value. Reference numeral i is set to an output current value of the comparing current generator 650. $I_{ref}$ is set to a saturation current flowing from a gate of the NMOS transistor 10 shown in FIG. 13. In this case, the output current value i is provided by the following formula.

$$i=(ai_1+bi_2)/(a+b)$$

In this formula, each of a and b is set to an arbitrary positive number.

A current amplification factor $\alpha$ is set to an input-to-output ratio of the detecting amplifying section 662 shown in FIG. 13. A current amplification factor $\beta$ is set to an input-to-output ratio of the dummy detecting amplifying section 663 shown in FIG. 13. A current amplification factor $\gamma$ is set to an input-to-output ratio of a current mirror structure used as a load circuit 664 shown in FIG. 13. For example, $\alpha=\beta\gamma$ is set. Further, a current value in an output section of the load circuit connected to an output section of the dummy detecting amplifying section 663 is set to $I_1$ with respect to the above current value $i_1$ and is set to $I_2$ with respect to the above current value $i_2$. In this case, $I_{ref}$ is provided as follows.

$$I_{ref}=\alpha \cdot (ai_1+bi_2)/(a+b)$$

Since $I_1=\alpha i_1$ and $I_2=\alpha i_2$ are formed, $I_{ref}$ is represented as follows.

$$I_{ref}=(aI_1+bI_2)/(a+b)$$

For example, in FIG. 13, the above ratio a is equal to a ratio of an electric current flowing through the PMOS transistor 9 to an electric current flowing through the PMOS diode (or transistor) 3. Further, for example, in FIG. 13, the above ratio $\beta$ is equal to a ratio of an electric current flowing through the PMOS transistor 22 to an electric current flowing through the PMOS transistor 16. Further, for example, in FIG. 13, the above ratio $\gamma$ is equal to a ratio of an electric current flowing through the NMOS transistor 23 to an electric current flowing through the NMOS transistor 10.

For example, when the comparing current generator 650 is constructed by the dummy semiconductor memories 653, 656 and the flow dividing circuit 661, the above values a and b are approximately set to one and the above value $i_2$ is equal to an output current from the dummy semiconductor memory 653 and the above value $i_1$ is equal to an output current from the dummy semiconductor memory 656. A sum $i_1+i_2$ of these output currents is attenuated by the flow dividing circuit 661. In this embodiment, as mentioned above, the flow dividing circuit 661 is constructed such that the flow dividing circuit 661 has a resistance value equivalent to that of the dummy detecting amplifying section 663 shown in FIG. 13. Accordingly, the above sum $i_1+i_2$ is reduced by half and the above value $I_{ref}$ corresponds to a value about half the sum of the turning-on current values $i_2$ and $i_1$ of the memory transistors having low and high region resistance values, respectively.

As mentioned above, in this embodiment, the above value $I_{ref}$ is determined in consideration of the leak current so that a detecting operation of the detecting amplifier can be more accurately performed.

In the above explanation, for example, the value of an electric current as a reference flowing through the NMOS transistor 10 is set to correspond to a value about half the sum of the turning-on current values $i_2$ and $i_1$ of the memory transistors having low and high region resistance values, respectively. However, the present invention is not limited to this case. For example, in this embodiment, the value of an electric current as a reference flowing through the NMOS transistor 10 can be set by changing the above ratios $\alpha$, $\beta$ and $\gamma$ about each of the current mirror structures in accordance with an arbitrary value between the turning-on current values $i_2$ and $i_1$ of the memory transistors having low and high region resistance values, respectively.

In this third embodiment, as mentioned above, the flow dividing circuit 661 is disposed and the above sum $i_1+i_2$ is reduced. However, for example, the value of a reference electric current flowing through the NMOS transistor 10 may be set to an intermediate value between current values $I_2$ and $I_1$ respectively corresponding to the turning-on current values of the memory transistors having low and high region resistance values by adjusting and changing the above ratios $\alpha$, $\beta$ and $\gamma$ about each of the current mirror structures in FIG. 6 as $\alpha:(\beta\gamma)$ without the flow dividing circuit 661.

When the comparing current generator 650 is constructed as above, a circuit structure of this comparing current generator is slightly large-sized. Accordingly, the comparing current generator 650 can be constructed as shown in FIG. 17 or 18 as one example.

In this example, the structure of the dummy semiconductor memory is changed to control a leak current or a turning-on current flowing out of the dummy semiconductor memory array. The dummy semiconductor memory normally has a structure shown in FIG. 15 or 16. In the case of the dummy semiconductor memory array shown in FIG. 15, a turning-on current value of this memory array is determined by memory transistors having low region resistance values and connected in series to each other in a block selector and a memory data transistor region. For example, these memory transistors are set to memory transistors 665, 666 and 667. Therefore, as shown in FIG. 17, memory transistors 668 to 671 having low region resistance values are connected in parallel to transistors constituting the memory data transistor region and having high region resistance values.

Figure 17:
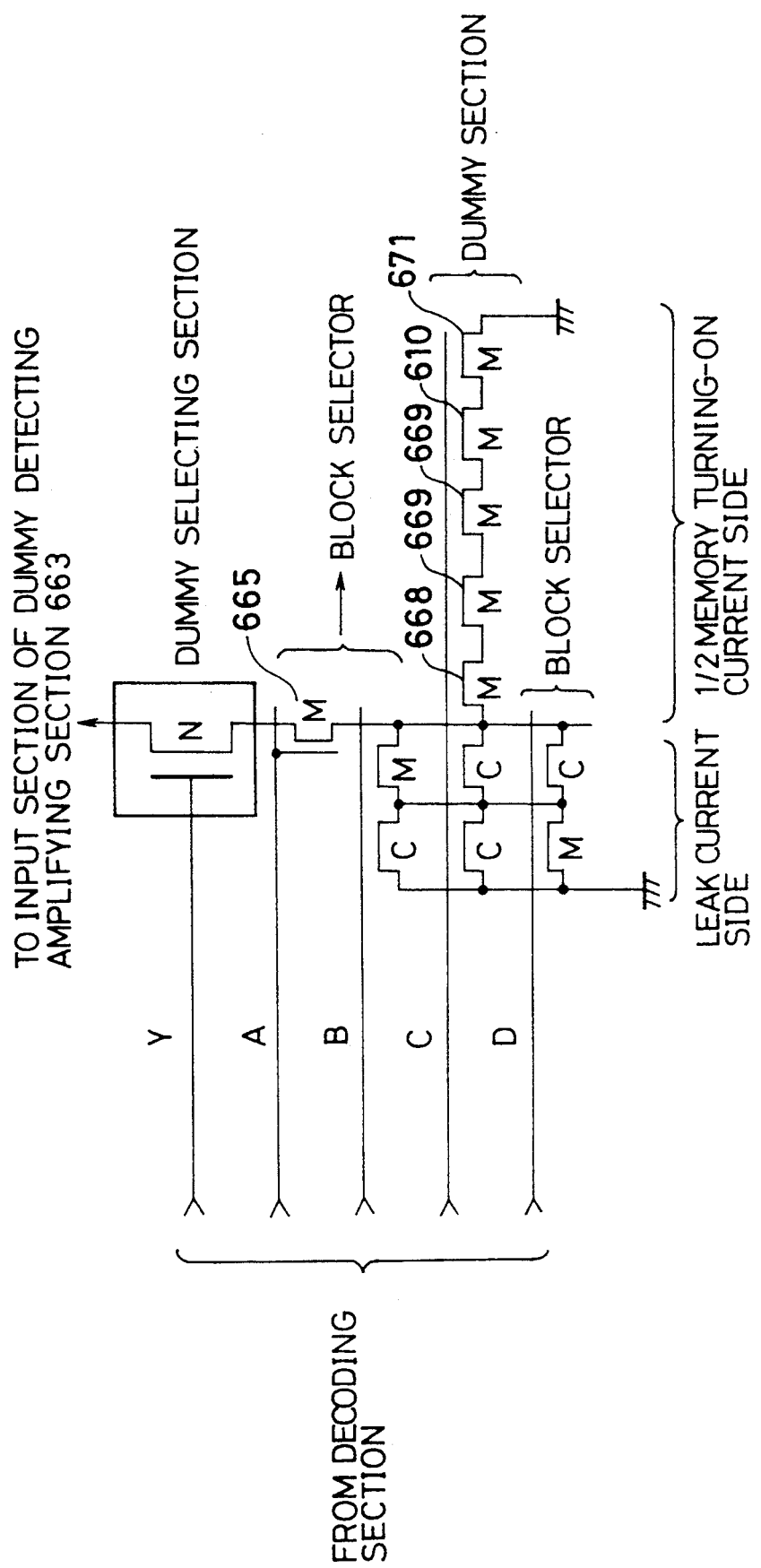
FIG. 17 is a circuit diagram illustrating one example of the dummy memory array showing another example of the comparing current generating means shown in FIG. 13.
Figure 18:
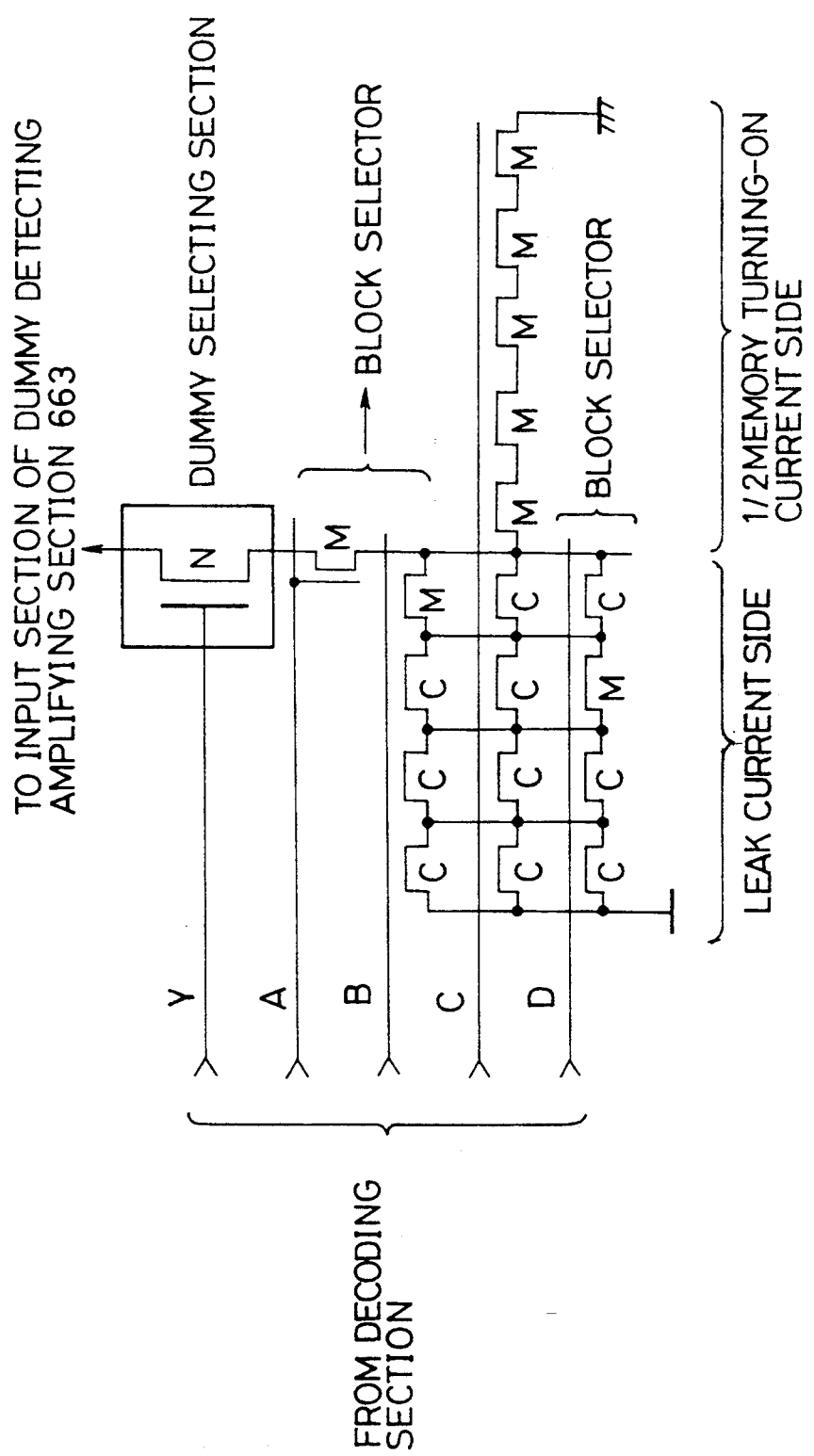
FIG. 18 is a circuit diagram illustrating another example of the dummy memory array showing another example of the comparing current generating means shown in FIG. 13.

As shown in FIG. 17, the five memory transistors 668 to 671 having low region resistance values are connected for the following reasons. Namely, in FIG. 15, three memory transistors 665, 666 and 667 having low region resistance values are connected in series to each other. Accordingly, the number of memory transistors having low region resistance values and connected in series to each other is doubled to set the turning-on current value to be about half a turning-on current value transmitted from the dummy semiconductor memory array shown in FIG. 15.

Figure 20:
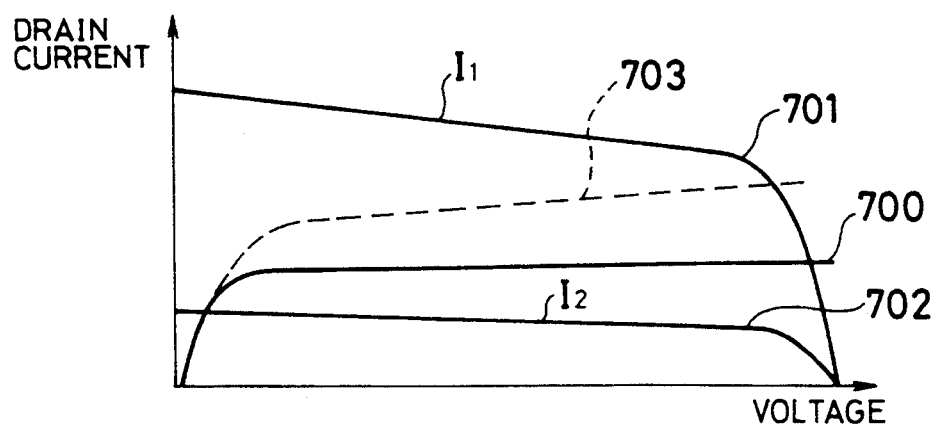
FIG. 20 is a graph showing current characteristics of selected memory transistors having low and high region resistance values and the characteristics of a reference electric current flowing through the NMOS transistor 10.

In this case, $\alpha=\beta$ and $\gamma=1$ should be set. However, for example, as shown in FIG. 20, when a leak current value is equal to or smaller than a value half the turning-on current value of the dummy semiconductor memory array and there is no leak current, a curve 700 showing current characteristics of the NMOS transistor 10 is approximately located in an intermediate position between current characteristic curves 701 and 702. In reality, the leak current exists so that the current characteristic curve 700 approaches the current characteristic curve 702. As mentioned above, the current characteristic curve 700 is changed to a current characteristic curve 703 shown by a dotted line by adding an electric current portion corresponding to the leak current to the electric current of the NMOS transistor 10. Thus, separating allowance or margin of the current characteristic curve 700 with respect to the current characteristic curve 702 can be increased. In other words, the above value $I_{ref}$ can be corrected such that the electric current portion corresponding to the leak current is added to the electric current of the NMOS transistor 10 shown by the current characteristic curve 700.

For example, the value of a reference electric current flowing through the NMOS transistor 10 can be set to a value providing a higher detecting accuracy with respect to an intermediate value between current values $I_2$ and $I_1$ respectively corresponding to the turning-on current values of the memory transistors having low and high region resistance values.

The dummy semiconductor memory array shown in FIG. 17 is constructed such that the leak current is added to this memory array as it is. However, as shown in FIG. 18, memory transistors having high region resistance values may be connected in parallel to each other such that the leak current is reduced. In such a structure, effects similar to those in FIG. 17 can be obtained. In this case, it is not necessary to set the leak current to be equal to or smaller than an electric current half the turning-on current of a memory transistor.

No circuit structure shown in FIG. 17 can be used unless the leak current value is equal to or smaller than an electric current value half the turning-on current value. Normally, the turning-on current value of a memory transistor is set to about 25 microamperes and the leak current value is set to about 10 to 20 microamperes. Accordingly, the above condition is sufficiently satisfied. Therefore, it is very effective to dispose the dummy semiconductor memory array shown in FIG. 17, etc. as a detecting amplifier having a compact circuit structure and a high detecting accuracy.

Conductivity types of transistors including memory transistors are not limited to those in the first to third embodiments, but P and N types of these transistors may be inverted.

As mentioned above, in accordance with a first structure of the present invention, a detecting amplifier comprises:
a first transistor 3 arranged between a first positive power source 2 and semiconductor memory means 600 and connected in series to the first positive power source 2 and having a low turning-on resistance value;
a second transistor 4 arranged between the first transistor 3 and the semiconductor memory means 600 and connected in series to the first transistor 3 and connected to a negative feedback circuit having a first inverting element 5; and
a third transistor 9 arranged between a second positive power source 8 and an output section 11 of the detecting amplifier and connected in series to the second positive power source 8 and constituting a current mirror structure together with the first transistor 3.

In accordance with a second structure of the present invention, the detecting amplifier in the first structure further comprises first noise removing means 6, 7 having a fourth transistor 7 having a gate for receiving an output signal of the first inverting element 5 through the second inverting element 6, and the first noise removing means 6, 7 prevents an increase in electric potential of an input section of the detecting amplifier caused by noises inputted to this input section between the second transistor 4 and the semiconductor memory means 600.

In accordance with a third structure of the present invention, the detecting amplifier in the first or second structure further comprises:
a fifth transistor 16 arranged between a third positive power source 15 and dummy semiconductor memory means 601 and connected in series to the third positive power source 15 and having a low turning-on resistance value;
a sixth transistor 17 arranged between the fifth transistor 16 and the dummy semiconductor memory means 601 and connected in series to the fifth transistor 16 and connected to a negative feedback circuit having a third inverting element 18;
a seventh transistor 22 connected in series to a fourth positive power source 21 and constituting a current mirror structure together with the fifth transistor 16;
second noise removing means 19, 20 having an eighth transistor 20 having a gate for receiving an output signal of the third inverting element 18 through a fourth inverting element 19;
the second noise removing means 19, 20 preventing an increase in electric potential of an input section caused by noises inputted to this input section between the sixth transistor 17 and the dummy semiconductor memory means 601; and
an output signal stabilizing section having ninth and tenth transistors 10, 23 which are respectively connected in series to the third transistor 9 and the seventh transistor 22 and constitute a current mirror structure.

In accordance with a fourth structure of the present invention, a detecting amplifier comprises:
an eleventh transistor 3 arranged between a fifth positive power source 100 and semiconductor memory means 600 and connected in series to the fifth positive power source 100 and having a low turning-on resistance value;

a twelfth transistor 4 arranged between the eleventh transistor 3 and the semiconductor memory means 600 and connected in series to the eleventh transistor and connected to a negative feedback circuit having a fifth inverting element 5; and a thirteenth transistor 9 arranged between the fifth positive power source 100 and the ground and connected in series to the fifth positive power source and constituting a current mirror structure together with the eleventh transistor 3;

a fourteenth transistor 101 connected between the thirteenth transistor 9 and the ground;

a fifteenth transistor 104 arranged between a sixth positive power source 103 and an output section of the detecting amplifier and connected in series to the sixth positive power source; and a sixteenth transistor 102 connected between the output section of the detecting amplifier and the ground and constituting a current mirror structure together with the fourteenth transistor 101.

In accordance with a fifth structure of the present invention, the detecting amplifier in the fourth structure further comprises:

a seventeenth transistor 352 arranged between a seventh positive power source 355 and dummy semiconductor memory means 601 and connected in series to the seventh positive power source and having a low turning-on resistance value;

an eighteenth transistor 353 arranged between the seventeenth transistor 352 and the dummy semiconductor memory means 601 and connected in series to the seventeenth transistor and connected to a negative feedback circuit having a sixth inverting element 354;

a nineteenth transistor 356 arranged between the seventh positive power source 355 and the ground and connected in series to the seventh positive power source and constituting a current mirror structure together with the seventeenth transistor 352;

a twentieth transistor 357 connected between the nineteenth transistor 356 and the ground;

a twenty-first transistor 359 arranged between an eighth positive power source 360 and the output section of the detecting amplifier and connected in series to the eighth positive power source and constituting a current mirror structure together with the fifteenth transistor 104; and a twenty-second transistor 358 connected between the output section of the detecting amplifier and the ground and constituting a current mirror structure together with the twentieth transistor 357.

In accordance with a sixth structure of the present invention, the detecting amplifier in the fourth or fifth structure further comprises:

reference voltage value transmitting means 250 connected to one dummy memory transistor having the same structure as a memory transistor constituting the semiconductor memory means and attaining a turning-on state;

the reference voltage value transmitting means 250 detecting a reference current value which is predetermined times the value of an electric current flowing through this dummy memory transistor;

precharge detecting means 300 connected to gates of the eleventh and thirteenth transistors and connected to an output side of the reference voltage value transmitting means;

the precharge detecting means 300 detecting a precharging state of the semiconductor memory means in which the value of an electric current flowing through the eleventh transistor is equal to or greater than the reference current value by comparing these current values with each other; and current supplying means 200 for strengthening precharge connected to an output side of the precharge detecting means;

the current supplying means 200 flowing an additional electric current between the eleventh transistor and the semiconductor memory means in addition to the electric current flowing through the eleventh transistor when the precharge detecting means detects that the semiconductor memory means is in the precharging state.

In accordance with a seventh structure of the present invention, the detecting amplifier in the sixth structure further comprises:

a seventeenth transistor 352 arranged between a seventh positive power source 355 and dummy semiconductor memory means 601 and connected in series to the seventh positive power source and having a low turning-on resistance value;

an eighteenth transistor 353 arranged between the seventeenth transistor 352 and the dummy semiconductor memory means and connected in series to the seventeenth transistor and connected to a negative feedback circuit having a seventh inverting element 354;

a nineteenth transistor 356 arranged between the seventh positive power source 355 and the ground and connected in series to the seventh positive power source and constituting a current mirror structure together with the seventeenth transistor 352;

a twentieth transistor 357 connected between the nineteenth transistor 356 and the ground;

a twenty-first transistor 359 connected in series to an eighth positive power source 360 and constituting a current mirror structure together with the fifteenth transistor;

a twenty-second transistor 358 connected between the twenty-first transistor 359 and the ground and constituting a current mirror structure together with the twentieth transistor 357;

second precharge detecting means 450 connected to gates of the seventeenth and nineteenth transistors and connected to the output side of the reference voltage value transmitting means;

the second precharge detecting means 450 detecting a precharging state of the dummy semiconductor memory means in which the values of electric currents flowing through the seventeenth and nineteenth transistors are equal to or greater than the reference current value by comparing these current values with each other; and second current supplying means 400 for strengthening precharge connected to an output side of the second precharge detecting means;

the second current supplying means 400 flowing an additional electric current between the seventeenth transistor and the dummy semiconductor memory means in addition to the electric current flowing through the seventeenth transistor when the second precharge detecting means detects that the dummy semiconductor memory means is in the prechargings rate.

In accordance with an eighth structure of the present invention, a detecting amplifier comprises:

detecting amplifying means 662 having an input side connected to an output side of semiconductor memory means 600 and having a current mirror structure and detecting an electric current value transmitted from a detecting object memory transistor within the semiconductor memory means;

dummy detecting amplifying means 663 having an input side connected to an output side of dummy semiconductor memory means obtained by simulating the semiconductor memory means and having a current mirror structure and detecting an electric current value transmitted from a dummy memory transistor within the dummy semiconductor memory means; and load means 664 having a load terminal connected to an input side of detecting output means 11 connected to an output side of the detecting amplifying means;

the load means 664 further having a control current input terminal connected to an output terminal of the dummy detecting amplifying means;

the load means 664 being constructed such that a reference electric current for determining a current value transmitted from the detecting output means flows through the load means in relation to a current value on the output side of the detecting amplifying means; and the dummy semiconductor memory means being constructed by comparing current generating means 650 for generating an electric current having an intermediate current value between maximum and minimum values of an electric current flowing through the detecting object memory transistor selected by the semiconductor memory means.

In accordance with a ninth structure of the present invention, the comparing current generating means 650 in the eighth structure comprises:

low resistance dummy semiconductor memory means 653 which has a dummy semiconductor memory array having a low turning-on resistance value and is connected to the input side of the dummy detecting amplifying means;

high resistance dummy semiconductor memory means 656 which has a dummy semiconductor memory array having a high turning-on resistance value and is connected to the input side of the dummy detecting amplifying means in parallel with an output side of the low resistance dummy semiconductor memory means; and flowing dividing means 661 having the same equivalent resistance value as the dummy detecting amplifying means and having an input side connected to an output side of a parallel connection of the high resistance dummy semiconductor memory means and the low resistance dummy semiconductor memory means.

In accordance with a tenth structure of the present invention, a detecting amplifier comprises:

detecting amplifying means 662 having an input side connected to an output side of semiconductor memory means 600 and having a current mirror structure and detecting an electric current value transmitted from a detecting object memory transistor within the semiconductor memory means;

dummy detecting amplifying means 663 having an input side connected to an output side of dummy semiconductor memory means obtained by simulating the semiconductor memory means and having a current mirror structure and detecting an electric current value transmitted from a dummy memory transistor within the dummy semiconductor memory means; and load means 664 having a load terminal connected to an input side of detecting output means 11 connected to an output side of the detecting amplifying means;

the load means 664 further having a control current input terminal connected to an output terminal of the dummy detecting amplifying means;

the load means 664 being constructed such that a reference electric current for determining a current value transmitted from the detecting output means flows through the load means in relation to a current value on the output side of the detecting amplifying means;

the dummy semiconductor memory means including:

low resistance dummy semiconductor memory means 653 which has a dummy semiconductor memory array having a low turning-on resistance value and is connected to the input side of the dummy detecting amplifying means; and high resistance dummy semiconductor memory means 656 which has a dummy semiconductor memory array having a high turning-on resistance value and is connected to the input side of the dummy detecting amplifying means in parallel with an output side of the low resistance dummy semiconductor memory means;

the dummy semiconductor memory means being constructed by comparing current generating means 650 for generating an electric current having an intermediate current value between maximum and minimum values of an electric current flowing through the detecting object memory transistor selected by the semiconductor memory means; and a current amplification factor provided by the current mirror structure of the detecting amplifying means 662 being larger than that provided by the current mirror structure of the dummy detecting amplifying means 663.

In accordance with an eleventh structure of the present invention, the comparing current generating means 650 in the eighth or tenth structure comprises:

semiconductor memory transistors each having a low turning-on resistance value and forming a current path reaching the ground in which the number of series connection stages of these semiconductor memory transistors is equal to or larger than that of memory transistors in the current path of a semiconductor memory array included in the semiconductor memory means toward the ground; and semiconductor memory transistors each having a high turning-on resistance value and connected in parallel to the semiconductor memory array and forming a current path reaching the ground in which the number of stages of these semiconductor memory transistors is equal to or larger than the number of series connection stages of the memory transistors in the current path of the semiconductor memory array included in the semiconductor memory means toward the ground.

As mentioned above in detail, in the present invention, first and third transistors constitute a current mirror structure so that a turning-on resistance value of the first transistor can be set to be low. Accordingly, an electric potential of the input section of a detecting amplifier can be controlled for a short time and an access time to a memory transistor can be reduced.

Further, in the present invention, when a noise removing means is disposed, no output signal of the detecting amplifier is influenced by noises when these noises are inputted to the input section of the detecting amplifier.

Further, when a dummy detecting amplifying section and a current mirror structure constructed by ninth and tenth transistors are disposed, an electric signal having a normal voltage level can be outputted from an output section of the detecting amplifier irrespective of memory transistor characteristics different from each other in accordance with manufacturing conditions of the detecting amplifier even when a memory transistor having a low turning-on resistance value is selected.

Further, in the present invention, eleventh and thirteenth transistors constitute a current mirror structure. A fourteenth transistor acts as a load element of the thirteenth transistor. The fourteenth transistor and a sixteenth transistor constitute a current mirror structure. A connection point between the sixteenth transistor and a fifteenth transistor is set to an output terminal of the detecting amplifier. In such a circuit structure, no fifteenth transistor relates to a precharging operation of a semiconductor memory means. Therefore, channel lengths of the fourteenth, fifteenth and sixteenth transistors can be set such that current characteristics of these transistors are approximately constant. Accordingly, it is possible to improve a current-to-voltage amplification factor of the detecting amplifier determined by the current characteristics of the fifteenth and sixteenth transistors. It is also possible to improve a detecting accuracy in electric potential at an output terminal of the semiconductor memory means.

A dummy side detecting amplifier having the same structure as a fourth structure for detecting an electric potential at the output terminal of a dummy semiconductor memory means is connected to the normal side detecting amplifier having the fourth structure. Accordingly, a detecting operation of the normal side detecting amplifier can be corrected by the dummy side detecting amplifier to perform a normal operation of the normal side detecting amplifier even when this detecting operation is unstable.

Further, in the present invention, when it is detected that an output side of the semiconductor memory means is in a precharging state, a precharging current is supplied to this output side from a current supplying means for strengthening precharge. Thus, it is possible to reduce a time required for precharge on the output side of the semiconductor memory means. Further, it is possible to restrain and set the value of an electric current flowing through the thirteenth transistor, etc. to be small so that power consumption can be reduced.

Further, the dummy side detecting amplifier has the dummy semiconductor memory means, a dummy side precharge detecting means and a current supplying means for strengthening precharge as a load. This dummy side detecting amplifier is connected to the normal side detecting amplifier having a sixth structure. Thus, a detecting operation of the normal side detecting amplifier can be corrected by the dummy side detecting amplifier to perform a normal operation of the normal side detecting amplifier even when memory transistor characteristics are different from each other in accordance with manufacturing conditions of the normal side detecting amplifier.

Further, in the present invention, the dummy semiconductor memory means is constructed by a comparing current generating means for generating an electric current having an intermediate current value between maximum and minimum values of an electric current flowing through a detecting object memory transistor selected by the semiconductor memory means. Thus, a reference current flowing through a load means can be set to an intermediate current value between current values corresponding to the maximum and minimum values of the electric current flowing through the detecting object memory transistor selected by the semiconductor memory means. Accordingly, the detecting operation of the detecting amplifier can be normally performed even when a leak current flows from a memory transistor having a high turning-on resistance value.

The comparing current generating means has low and high resistance dummy semiconductor memory means respectively having low and high resistances and has a flow dividing means. Accordingly, a reference current flowing through a load means can be set to an intermediate current value between current values corresponding to the maximum and minimum values of the electric current flowing through the detecting object memory transistor selected by the semiconductor memory means. Therefore, the detecting operation of the detecting amplifier can be normally performed even when a leak current flows from a memory transistor having a high turning-on resistance value.

Further, in the present invention, a current amplification factor provided by a current mirror structure in the detecting amplifying means is set to be larger than that in the above dummy detecting amplifying means. Accordingly, a reference current flowing through a load means can be set to an intermediate current value between current values corresponding to the maximum and minimum values of the electric current flowing through the detecting object memory transistor selected by the semiconductor memory means. Therefore, the detecting operation of the detecting amplifier can be normally performed even when a leak current flows from a memory transistor having a high turning-on resistance value.

For example, since the leak current exists, saturation current characteristics in a gate of the ninth transistor are close to the current characteristics of a dummy semiconductor memory having a high region resistance value. However, when the comparing current generating means has dummy semiconductor memory transistors having low or high turning-on resistance values at increased stages, the reference current is increased in accordance with the leak current and can be approximately set to an intermediate electric current between electric currents of semiconductor memories having low and high region resistance values. In other words, the above saturation current characteristics can be corrected such that a leak current is added to the saturation current.

Many widely different embodiments of the present invention may be constructed without departing from the spirit and scope of the present invention. It should be understood that the present invention is not limited to the specific embodiments described in the specification, except as defined in the appended claims.

What is claimed is:

1. A detecting amplifier comprising:
   a first transistor arranged between a first positive power source and a semiconductor memory means and connected in series to the first positive power source and having a low turning-on resistance value such that no lower limit value of a voltage drop value by the turning-on resistance value of the first transistor is equal to or smaller than a voltage value on a bit line;
   a second transistor arranged between the first transistor and the semiconductor memory means and connected in series to the first transistor and connected to a negative feedback circuit having a first inverting element; and
   a third transistor arranged between a second positive power source and an output section of the detecting amplifier and connected in series to the second positive power source and constituting a current mirror structure together with the first transistor.

2. A detecting amplifier comprising:
   a first transistor arranged between a first positive power source and semiconductor memory means and connected in series to the first positive power source and having a low turning-on resistance value;
   a second transistor arranged between the first transistor and the semiconductor memory means and connected in series to the first transistor and connected to a negative feedback circuit having a first inverting element;
   a third transistor arranged between a second positive power source and an output section of the detecting amplifier and connected in series to the second positive power source and constituting a current mirror structure together with the first transistor; and
   first noise removing means having a fourth transistor having a gate for receiving an output signal of said first inverting element through a second inverting element,
   wherein the first noise removing means prevents an increase in electric potential of an input section of the detecting amplifier caused by noises inputted to this input section between the second transistor and the semiconductor memory means.

3. A detecting amplifier as claimed in claim 2, wherein the detecting amplifier further comprises:
   a fifth transistor arranged between a third positive power source and a dummy semiconductor memory means and connected in series to the third positive power source and having a low turning-on resistance value;
   a sixth transistor arranged between the fifth transistor and the dummy semiconductor memory means and connected in series to the fifth transistor and connected to a negative feedback circuit having a third inverting element;
   a seventh transistor connected in series to a fourth positive power source and constituting a current mirror structure together with the fifth transistor;
   second noise removing means having an eighth transistor having a gate for receiving an output signal of said third inverting element through a fourth inverting element;
   said second noise removing means preventing an increase in electric potential of an input section caused by noises inputted to this input section between the sixth transistor and the dummy semiconductor memory means; and
   an output signal stabilizing section having ninth and tenth transistors which are respectively connected in series to the third transistor and the seventh transistor and constitute a current mirror structure.

4. A detecting amplifier comprising:
   a first transistor arranged between a first positive power source and semiconductor memory means and connected in series to the first positive power source and having a low turning-on resistance value such that no lower limit value of a voltage drop value by the turning-on resistance value of the first transistor is equal to or smaller than a voltage value on a bit line;
   a second transistor arranged between the first transistor and the semiconductor memory means and connected in series to the first transistor and connected to a negative feedback circuit having a first inverting element; and
   a third transistor arranged between the first positive power source and the ground and connected in series to the first positive power source and constituting a current mirror structure together with the first transistor;
   a fourth transistor connected between the third transistor and the ground;
   a fifth transistor arranged between a second positive power source and an output section of the detecting amplifier and connected in series to said second positive power source; and
   a sixth transistor connected between said output section of the detecting amplifier and the ground and constituting a current mirror structure together with said fourth transistor.

5. A detecting amplifier as claimed in claim 4, wherein the detecting amplifier further comprises:
   a seventh transistor arranged between a third positive power source and a dummy semiconductor memory means and connected in series to the third positive power source and having a low turning-on resistance value such that no lower limit value of a voltage drop by the turning-on resistance value of the seventh transistor is equal to or smaller than a voltage value on a bit line;
   an eighth transistor arranged between the seventh transistor and the dummy semiconductor memory means and connected in series to the seventh transistor and connected to a negative feedback circuit having a second inverting element;
   a ninth transistor arranged between the third positive power source and the ground and connected in series to the third positive power source and constituting a current mirror structure together with the seventh transistor;
   a tenth transistor connected between the ninth transistor and the ground;
   an eleventh transistor arranged between a fourth positive power source and the output section of the detecting amplifier and connected in series to the fourth positive power source and constituting a current mirror structure together with said fifth transistor; and
   a twelfth transistor connected between said output section of the detecting amplifier and the ground and constituting a current mirror structure together with said tenth transistor.

6. A detecting amplifier comprising:
a first transistor arranged between a first positive power source and a semiconductor memory means and connected in series to the first positive power source and having a low turning-on resistance value;
a second transistor arranged between the first transistor and the semiconductor memory means and connected in series to the first transistor and connected to a negative feedback circuit having a first inverting element; and
a third transistor arranged between the first positive power source and the ground and connected in series to the first positive power source and constituting a current mirror structure together with the first transistor;
a fourth transistor connected between the third transistor and the ground;
a fifth transistor arranged between a second positive power source and an output section of the detecting amplifier and connected in series to said second positive power source;
a sixth transistor connected between said output section of the detecting amplifier and the ground and constituting a current mirror structure together with said fourth transistor;
reference voltage value transmitting means connected to a dummy memory transistor having the same structure as a memory transistor constituting said semiconductor memory means and attaining a turning-on state;
the reference voltage value transmitting means detecting a reference current value which is predetermined times the value of an electric current flowing through said dummy memory transistor;
precharge detecting means connected to gates of said first and third transistors and connected to an output side of said reference voltage value transmitting means;
the precharge detecting means detecting a precharging state of said semiconductor memory means in which the value of an electric current flowing through said first transistor is equal to or greater than said reference current value by comparing these current values with each other; and
current supplying means for strengthening precharge connected to an output side of said precharge detecting means;
the current supplying means flowing an additional electric current between said first transistor and said semiconductor memory means in addition to the electric current flowing through said first transistor when said precharge detecting means detects that said semiconductor memory means is in the precharging state.

7. A detecting amplifier as claimed in claim 6, wherein the detecting amplifier further comprises:
a seventh transistor arranged between a third positive power source and a dummy semiconductor memory means and connected in series to the third positive power source and having a low turning-on resistance value;
an eighth transistor arranged between the seventh transistor and the dummy semiconductor memory means and connected in series to the seventh transistor and connected to a negative feedback circuit having a second inverting element;
a ninth transistor arranged between the third positive power source and the ground and connected in series to the third positive power source and constituting a current mirror structure together with the seventh transistor;
a tenth transistor connected between the ninth transistor and the ground;
an eleventh transistor connected in series to a fourth positive power source and constituting a current mirror structure together with said fifth transistor; and
a twelfth transistor connected between said eleventh transistor and the ground and constituting a current mirror structure together with said tenth transistor;
second precharge detecting means connected to gates of said seventh and ninth transistors and connected to the output side of said reference voltage value transmitting means;
the second precharge detecting means detecting a precharging state of said dummy semiconductor memory means in which the values of electric currents flowing through said seventh and ninth transistors are equal to or greater than said reference current value by comparing these current values with each other; and
second current supplying means for strengthening precharge connected to an output side of said second precharge detecting means;
the second current supplying means flowing an additional electric current between said seventh transistor and said dummy semiconductor memory means in addition to the electric current flowing through said seventh transistor when said second precharge detecting means detects that said dummy semiconductor memory means is in the precharging state.

8. A detecting amplifier comprising:
detecting amplifying means having an input side connected to an output side of a semiconductor memory means and having a current mirror structure and detecting an electric current value transmitted from a detecting object memory transistor within said semiconductor memory means;
dummy detecting amplifying means having an input side connected to an output side of a dummy semiconductor memory means obtained by simulating said semiconductor memory means and having a current mirror structure and detecting an electric current value transmitted from a dummy memory transistor within said dummy semiconductor memory means; and
load means having a load terminal connected to an input side of detecting output means connected to an output side of said detecting amplifying means;
the load means further having a control current input terminal connected to an output terminal of said dummy detecting amplifying means;
the load means being constructed such that a reference electric current for determining a current value transmitted from said detecting output means flows through the load means in relation to a current value on the output side of said detecting amplifying means;
said dummy semiconductor memory means being constructed by comparing current generating means for generating an electric current having an intermediate current value between maximum and minimum values of an electric current flowing through the detecting object memory transistor selected by said semiconductor memory means; and said comparing current generating means comprising low resistance dummy semiconductor memory means which has a dummy semiconductor memory having a low turning-on resistance value and high resistance dummy semiconductor memory means which has a dummy semiconductor memory having a high turning-on resistance value.

9. A detecting amplifier comprising:

detecting amplifying means having an input side connected to an output side of a semiconductor memory means and having a current mirror structure and detecting an electric current value transmitted from a detecting object memory transistor within said semiconductor memory means;

dummy detecting amplifying means having an input side connected to an output side of a dummy semiconductor memory means obtained by simulating said semiconductor memory means and having a current mirror structure and detecting an electric current value transmitted from a dummy memory transistor within said dummy semiconductor memory means;

load means having a load terminal connected to an input side of detecting output means connected to an output side of said detecting amplifying means;

the load means further having a control current input terminal connected to an output terminal of said dummy detecting amplifying means;

the load means being constructed such that a reference electric current for determining a current value transmitted from said detecting output means flows through the load means in relation to a current value on the output side of said detecting amplifying means;

said dummy semiconductor memory means being constructed by comparing current generating means for generating an electric current having an intermediate current value between maximum and minimum values of an electric current flowing through the detecting object memory transistor selected by said semiconductor memory means, wherein said comparing current generating means comprises:

low resistance dummy semiconductor memory means which has a dummy semiconductor memory array having a low turning-on resistance value and is connected to the input side of said dummy detecting amplifying means;

high resistance dummy semiconductor memory means which has a dummy semiconductor memory array having a high turning-on resistance value and is connected to the input side of said dummy detecting amplifying means in parallel with an output side of said low resistance dummy semiconductor memory means; and flowing dividing means having the same equivalent resistance value as said dummy detecting amplifying means and having an input side connected to an output side of a parallel connection of said high resistance dummy semiconductor memory means and said low resistance dummy semiconductor memory means.

10. A detecting amplifier comprising:

detecting amplifying means having an input side connected to an output side of a semiconductor memory means and having a current mirror structure and detecting an electric current value transmitted from a detecting object memory transistor within said semiconductor memory means;

dummy detecting amplifying means having an input side connected to an output side of a dummy semiconductor memory means obtained by simulating said semiconductor memory means and having a current mirror structure and detecting an electric current value transmitted from a dummy memory transistor within said dummy semiconductor memory means;

load means having a load terminal connected to an input side of detecting output means connected to an output side of said detecting amplifying means;

the load means further having a control current input terminal connected to an output terminal of said dummy detecting amplifying means;

the load means being constructed such that a reference electric current for determining a current value transmitted from said detecting output means flows through the load means in relation to a current value on the output side of said detecting amplifying means;

said dummy semiconductor memory means being constructed by comparing current generating means for generating an electric current having an intermediate current value between maximum and minimum values of an electric current flowing through the detecting object memory transistor selected by said semiconductor memory means, wherein said comparing current generating means comprises:

semiconductor memory transistors each having a low turning-on resistance value and forming a current path reaching the ground in which the number of series connection stages of these semiconductor memory transistors is equal to or larger than that of memory transistors in the current path of a semiconductor memory array included in said semiconductor memory means toward the ground; and semiconductor memory transistors each having a high turning-on resistance value and connected in parallel to said semiconductor memory array and forming a current path reaching the ground in which the number of stages of these semiconductor memory transistors is equal to or larger than the number of series connection stages of the memory transistors in the current path of the semiconductor memory array included in said semiconductor memory means toward the ground.

11. A detecting amplifier comprising:

detecting amplifying means having an input side connected to an output side of a semiconductor memory means and having a current mirror structure and detecting an electric current value transmitted from a detecting object memory transistor within said semiconductor memory means;

dummy detecting amplifying means having an input side connected to an output side of a dummy semiconductor memory means obtained by simulating said semiconductor memory means and having a current mirror structure and detecting an electric current value transmitted from a dummy memory transistor within said dummy semiconductor memory means; and load means having a load terminal connected to an input side of detecting output means connected to an output side of said detecting amplifying means;

the load means further having a control current input terminal connected to an output terminal of said dummy detecting amplifying means;

the load means being constructed such that a reference electric current for determining a current value transmitted from said detecting output means flows through the load means in relation to a current value on the output side of said detecting amplifying means;

said dummy semiconductor memory means including:

low resistance dummy semiconductor memory means which has a dummy semiconductor memory array having a low turning-on resistance value and is connected to the input side of said dummy detecting amplifying means; and high resistance dummy semiconductor memory means which has a dummy semiconductor memory array having a high turning-on resistance value and is connected to the input side of said dummy detecting amplifying means in parallel with an output side of said low resistance dummy semiconductor memory means;

said dummy semiconductor memory means being constructed by comparing current generating means for generating an electric current having an intermediate current value between maximum and minimum values of an electric current flowing through the detecting object memory transistor selected by said semiconductor memory means; and a current amplification factor provided by the current mirror structure of said detecting amplifying means being larger than that provided by the current mirror structure of said dummy detecting amplifying means.

12. A detecting amplifier as claimed in claim 11, wherein said comparing current generating means comprises:

semiconductor memory transistors each having a low turning-on resistance value and forming a current path reaching the ground in which the number of series connection stages of these semiconductor memory transistors is equal to or larger than that of memory transistors in the current path of a semiconductor memory array included in said semiconductor memory means toward the ground; and semiconductor memory transistors each having a high turning-on resistance value and connected in parallel to said semiconductor memory array and forming a current path reaching the ground in which the number of stages of these semiconductor memory transistors is equal to or larger than the number of series connection stages of the memory transistors in the current path of the semiconductor memory array included in said semiconductor memory means toward the ground.

13. A detecting amplifier as claimed in claim 1, wherein the detecting amplifier further comprises:

a fifth transistor arranged between a third positive power source and a dummy semiconductor memory means and connected in series to the third positive power source and having a low turning-on resistance value;

a sixth transistor arranged between the fifth transistor and the dummy semiconductor memory means and connected in series to the fifth transistor and connected to a negative feedback circuit having a third inverting element;

a seventh transistor connected in series to a fourth positive power source and constituting a current mirror structure together with the fifth transistor;

second noise removing means having an eighth transistor having a gate for receiving an output signal of said third inverting element through a fourth inverting element;

said second noise removing means preventing an increase in electric potential of an input section caused by noises inputted to this input section between the sixth transistor and the dummy semiconductor memory means; and an output signal stabilizing section having ninth and tenth transistors which are respectively connected in series to the third transistor and the seventh transistor and constitute a current mirror structure.

14. A detecting amplifier comprising:

a first transistor arranged between a first positive power source and semiconductor memory means and connected in series to the first positive power source and having a low turning-on resistance value;

a second transistor arranged between the first transistor and the semiconductor memory means and connected in series to the first transistor and connected to a negative feedback circuit having a first inverting element; and a third transistor arranged between the first positive power source and the ground and connected in series to the first positive power source and constituting a current mirror structure together with the first transistor;

a fourth transistor connected between the third transistor and the ground;

a fifth transistor arranged between a second positive power source and an output section of the detecting amplifier and connected in series to said second positive power source; and a sixth transistor connected between said output section of the detecting amplifier and the ground and constituting a current mirror structure together with said fourth transistor;

a seventh transistor arranged between a third positive power source and a dummy semiconductor memory means and connected in series to the third positive power source and having a low turning-on resistance value;

an eighth transistor arranged between the seventh transistor and the dummy semiconductor memory means and connected in series to the seventh transistor and connected to a negative feedback circuit having a second inverting element;

a ninth transistor arranged between the third positive power source and the ground and connected in series to the third positive power source and constituting a current mirror structure together with the seventh transistor;

a tenth transistor connected between the ninth transistor and the ground;

an eleventh transistor arranged between a fourth positive power source and the output section of the detecting amplifier and connected in series to the fourth positive power source and constituting a current mirror structure together with said fifth transistor; and a twelfth transistor connected between said output section of the detecting amplifier and the ground and constituting a current mirror structure together with said tenth transistor;

reference voltage value transmitting means connected to a dummy memory transistor having the same structure as a memory transistor constituting said semiconductor memory means and attaining a turning-on state;

the reference voltage value transmitting means detecting a reference current value which is predetermined times the value of an electric current flowing through said dummy memory transistor;

precharge detecting means connected to gates of said first and third transistors and connected to an output side of said reference voltage value transmitting means;

the precharge detecting means detecting a precharging state of said semiconductor memory means in which the value of an electric current flowing through said first transistor is equal to or greater than said reference current value by comparing these current values with each other; and current supplying means for strengthening precharge connected to an output side of said precharge detecting means;

the current supplying means flowing an additional electric current between said first transistor and said semiconductor memory means in addition to the electric current flowing through said first transistor when said precharge detecting means detects that said semiconductor memory means is in the precharging state.

15. A detecting amplifier as claimed in claim 14, wherein the detecting amplifier further comprises:

second precharge detecting means connected to gates of said seventh and ninth transistors and connected to the output side of said reference voltage value transmitting means;

the second precharge detecting means detecting a precharging state of said dummy semiconductor memory means in which the values of electric currents flowing through said seventh and ninth transistors are equal to or greater than said reference current value by comparing these current values with each other; and second current supplying means for strengthening precharge connected to an output side of said second precharge detecting means;

the second current supplying means flowing an additional electric current between said seventh transistor and said dummy semiconductor memory means in addition to the electric current flowing through said seventh transistor when said second precharge detecting means detects that said dummy semiconductor memory means is in the precharging state.

* * * * *